United States Patent
Choi

(10) Patent No.: US 7,366,020 B2
(45) Date of Patent: Apr. 29, 2008

(54) FLASH MEMORY DEVICE CAPABLE OF PREVENTING AN OVERERASE OF FLASH MEMORY CELLS AND ERASE METHOD THEREOF

(75) Inventor: Ki-Hwan Choi, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/670,383

(22) Filed: Feb. 1, 2007

(65) Prior Publication Data

US 2007/0183219 A1  Aug. 9, 2007

Related U.S. Application Data

(60) Continuation-in-part of application No. 11/141,732, filed on May 31, 2005, now Pat. No. 7,190,624, which is a continuation-in-part of application No. 10/430,364, filed on May 5, 2003, now Pat. No. 6,914,827, which is a continuation-in-part of application No. 10/016,579, filed on Nov. 1, 2001, now Pat. No. 6,577,540, which is a division of application No. 09/626,172, filed on Jul. 27, 2000, now Pat. No. 6,314,027.

(30) Foreign Application Priority Data

Jul. 29, 1999 (KR) .............................. 1999-30872

(51) Int. Cl.
*G11C 11/34* (2006.01)
(52) U.S. Cl. ........................... 365/185.18; 365/185.17; 365/185.19; 365/185.29; 365/185.24; 365/218
(58) Field of Classification Search .......... 365/185.18, 365/185.17, 185.29, 185.24, 218
See application file for complete search history.

(56) References Cited

U.S. PATENT DOCUMENTS

| | | | |
|---|---|---|---|
| 5,132,935 | A | 7/1992 | Ashmore, Jr. |
| 5,220,533 | A | 6/1993 | Turner |
| 5,287,317 | A | 2/1994 | Kobayashi et al. |
| 5,513,193 | A | 4/1996 | Hashimoto |

(Continued)

FOREIGN PATENT DOCUMENTS

JP          10-55691          2/1998

OTHER PUBLICATIONS

Atsumi, Shigero, et al., "A 3.3V-only 16Mb Flash Memory with Row-Decoding Scheme," 1996 IEEE International Solid-State Circuits Conference, vol. 2, pp. 42-43.

*Primary Examiner*—Viet Q. Nguyen
(74) *Attorney, Agent, or Firm*—Marger Johnson & McCollom, P.C.

(57) ABSTRACT

We describe a NAND flash memory device including a memory cell array formed on a substrate including a plurality of cell strings each including a string selecting transistor, a ground selecting transistor, and plural memory cells serially coupled between the string selecting transistor and the ground selecting transistor. A high voltage generator is configured to supply a bulk voltage to the substrate and an erase control circuit is configured to stepwise increase the bulk voltage during a first period of an erase operation and to maintain the bulk voltage substantially constant during a second period of the erase operation.

22 Claims, 26 Drawing Sheets

U.S. PATENT DOCUMENTS

| | | |
|---|---|---|
| 5,732,022 A | 3/1998 | Kato et al. |
| 5,745,417 A | 4/1998 | Kobayashi et al. |
| 5,768,193 A | 6/1998 | Lee et al. |
| 5,781,477 A | 7/1998 | Rinerson et al. |
| 5,801,993 A | 9/1998 | Choi |
| 5,805,501 A | 9/1998 | Shiau et al. |
| 5,825,062 A | 10/1998 | Muramoto |
| 5,870,334 A | 2/1999 | Hemink et al. |
| 5,877,980 A * | 3/1999 | Mang et al. ............ 365/185.17 |
| 5,903,495 A | 5/1999 | Takeuchi et al. |
| 5,914,896 A * | 6/1999 | Lee et al. ............... 365/185.19 |
| 5,917,755 A | 6/1999 | Rinerson et al. |
| 5,917,757 A | 6/1999 | Lee et al. |
| 5,930,174 A | 7/1999 | Chen et al. |
| 5,953,255 A | 9/1999 | Lee |
| 5,963,479 A | 10/1999 | Park et al. |
| 5,963,480 A | 10/1999 | Harari |
| 5,978,277 A * | 11/1999 | Hsu et al. ............... 365/185.29 |
| 6,046,935 A | 4/2000 | Takeuchi et al. |
| 6,064,596 A * | 5/2000 | Choi et al. ............. 365/185.22 |
| 6,163,485 A | 12/2000 | Kawahara et al. |
| 6,188,609 B1 | 2/2001 | Sunkavalli et al. |
| 6,222,772 B1 * | 4/2001 | Choi et al. ............. 365/185.22 |
| 6,285,597 B2 | 9/2001 | Kawahara et al. |
| 6,307,807 B1 * | 10/2001 | Sakui et al. ............. 365/238.5 |
| 6,314,026 B1 | 11/2001 | Satoh et al. |
| 6,314,027 B1 * | 11/2001 | Choi ...................... 365/185.29 |
| 6,314,207 B1 | 11/2001 | Persiantsev et al. |
| 6,330,192 B1 | 12/2001 | Ohba et al. |
| 6,370,081 B1 * | 4/2002 | Sakui et al. ............. 365/238.5 |
| 6,407,944 B1 * | 6/2002 | Choi et al. ............. 365/185.09 |
| 6,442,075 B2 | 8/2002 | Hirano |
| 6,459,621 B1 | 10/2002 | Kawahara et al. |
| 6,483,747 B2 * | 11/2002 | Choi et al. ............. 365/185.09 |
| 6,490,204 B2 | 12/2002 | Bloom et al. |
| 6,496,418 B2 | 12/2002 | Kawahara et al. |
| 6,501,765 B1 * | 12/2002 | Lu et al. ..................... 370/447 |
| 6,504,765 B1 * | 1/2003 | Joo ........................ 365/185.29 |
| 6,512,262 B2 * | 1/2003 | Watanabe .................... 257/316 |
| 6,515,908 B2 | 2/2003 | Miyawaki et al. |
| 6,529,413 B2 * | 3/2003 | Lee et al. ............... 365/185.22 |
| 6,577,540 B2 * | 6/2003 | Choi ........................ 365/185.3 |
| 6,643,188 B2 | 11/2003 | Tanaka et al. |
| 6,795,347 B2 * | 9/2004 | Ausserlechner et al. ..................... 365/185.28 |
| 6,914,827 B2 * | 7/2005 | Choi ...................... 365/185.29 |
| 7,190,624 B2 * | 3/2007 | Choi ...................... 365/185.29 |
| 2002/0060929 A1 | 5/2002 | Choi |

* cited by examiner

<Pre-Verify>

($0V < V_{PRE\_VERI} <$ Minimum Vth of off cell)

<Verify>

<Pre-Verify>

<Verify>

FLASH MEMORY DEVICE CAPABLE OF PREVENTING AN OVERERASE OF FLASH MEMORY CELLS AND ERASE METHOD THEREOF

This application is a continuation-in-part of U.S. patent application Ser. No. 11/141,732, filed on May 31, 2005, now U.S. Pat. No. 7,190,624, which is a continuation-in-part of U.S. patent application Ser. No. 10/430,364, filed on May 5, 2003, now issued U.S. Pat. No. 6,914,827, which is a continuation-in-part of U.S. patent application Ser. No. 10/016,579, now issued U.S. Pat. No. 6,577,540, which is a divisional of U.S. patent application Ser. No. 09/626,172, now issued U.S. Pat. No. 6,314,027, which claims priority from Korean Patent Application No. 1999-30872, filed on Jul. 28, 1999, all of which are hereby incorporated by reference in their entirety.

FIELD

The present invention relates generally to nonvolatile memory devices and, more particularly, to a flash memory device capable of preventing flash memory cells from being overerased and an erase method thereof.

BACKGROUND

Nonvolatile memory devices have become increasingly popular, especially flash memory devices. FIG. 1 shows a conventional flash memory cell. The flash memory cell has source and drain regions 2 and 3, respectively, formed in a P-type semiconductor substrate 1 (or bulk), a floating gate 6 formed over a channel region 5 and between the source and drain regions 2 and 3, respectively. A thin (100 .ANG.) insulator 4 is interposed between the floating gate 6 and the substrate 1. A control gate 8 is formed over the floating gate 6 with a second insulator 7 interposed therebetween. The control gate 8 is coupled to a wordline.

Table 1 shows the conventional approach to programming, reading, erasing, and erase-verifying the flash memory cell shown in FIG. 1.

TABLE 1

|    | PROGRAM | READ   | ERASE       | VERIFY |
|----|---------|--------|-------------|--------|
| Vg | +5 V    | +10 V  | −10 V       | +3 V   |
| Vd | +1 V    | +5 V   | FLOAT       | +5 V   |
| Vs | GROUND  | GROUND | FLOAT       | GROUND |
| Vb | GROUND  | GROUND | +6 V to +9 V | GROUND |

The flash memory cell is programmed by applying a ground (0V) to the source 2 and the bulk 1, a high voltage of +10V to the control gate 8, and a positive voltage of +5V to the drain 3 resulting in appropriate hot electron generation. The above-described voltages cause a sufficient amount of negative charges to accumulate in the floating gate 6 creating a (−) potential. The (−) potential forces a threshold voltage of the flash memory cell to be increased during reading.

During a read operation, a voltage of +5V is applied to the control gate 8 and the ground voltage is applied to the source 3. Under these conditions, the channel of the programmed memory cell is nonconductive. That is, no current flows from the drain 3 to the source 2 via the channel 5. At this time, the programmed memory is in an off state, and its threshold voltage, as illustrated in FIG. 2, is distributed within about +7V to +9V.

Flash memory cells in a sector are simultaneously erased by means of the so-called Fowler-Nordheim (F-N) tunneling mechanism. According to the F-N tunneling mechanism, a negative high voltage of about −10V is applied to the control gate 8 of each memory cell transistor and a positive voltage between about +6V to +9V—suitable to make the F-N tunneling—is applied to the substrate 1. Under this bias condition, the drain and source 2 and 3, respectively, of each cell are maintained at a floating state as shown in Table 1. This erase scheme is termed Negative Gate and Bulk Erase (NGBE). A strong electric field between 6 to 7 MV/cm is generated between the control gate 8 and the bulk 1 under the above-described bias condition, so that negative charges accumulated in the floating gate 6 are discharged into the source 2 through the thin insulator 5. The negative charges force a reduction in the threshold voltage of the memory cell during reading.

The particulars of various bulk erase methods associated with a flash memory device are disclosed in U.S. Pat. No. 5,781,477 entitled "FLASH MEMORY SYSTEM HAVING FAST ERASE OPERATION", U.S. Pat. No. 5,132,935 entitled "ERASURE OF EEPROM MEMORY ARRAYS TO PREVENT OVERERASED CELLS", U.S. Pat. No. 5,220,533 entitled "METHOD AND APPARATUS FOR PREVENTING ERVERERASURE IN A FLASH CELL", U.S. Pat. No. 5,513,193 entitled "NON-VOLATITLE SEMICONDUCTOR MEMORY DEVICE CAPABLE OF CHECKING THE THRESHOLD VALUE OF MEMORY CELLS", and U.S. Pat. No. 5,805,501 entitled "FLASH MEMORY DEVICE WITH MULTIPLE CHECKPOINT ERASE SUSPEND LOGIC", incorporated herein by reference.

After performing the above-described NBGE operation, an erase verification operation is performed to check whether a threshold voltage of each flash memory cell in the sector exists in a target threshold voltage range corresponding to the on state (e.g., +1V to +3V). During the erase verification operation, as shown in Table 1, an erase verification voltage of about +3V is applied to the control gate 8, a voltage of about +5V to the drain 3, and the ground voltage (0V) to the source 2 and the bulk 1.

Typically, the threshold voltage of the erased memory cell is distributed in a range of +1V to +3V. However, when all of the memory cells in the sector are simultaneously erased, a threshold voltage of one or more flash memory cells can be lowered below +1V. When this happens the flash memory cell is termed an overerased cell. The overerased cell can be cured by an erase repair operation that shifts the threshold voltage of the overerased cell back to a target threshold voltage range of the on cell (e.g., +1V to +3V).

The erase repair operation is carried out by applying the ground voltage (0V) to the source 2 and the bulk 1 of the overerased cell, a voltage of about +3V to the control gate 8, and a voltage of about +5V the drain 3. This bias condition accumulates charges in the floating gate 6 of an amount less than those accumulated during a program operation. The erase repair operation, as illustrated in FIG. 2, results in the threshold voltage of the overerased memory cell shifting back into the target threshold voltage distribution (e.g., +1V to +3V).

One problem associated with the above-described erase method is the length of time that it takes to perform the additional erase repair operation. This is because the repair operation increases the overall time it takes to erase the memory cell. As well known to those skilled in the art, such a problem arises when excess electric field is applied across the floating gate of the flash memory cell.

Applying a weaker electric field can lower the time it takes to perform an NGBE erase operation. The overall erase time, however, remains unchanged because while applying a weaker electric field results in none to fewer overerased cells, eliminating the time required to perform the overerase repair operation, the actual erase operation takes longer.

Similar to NOR flash memory devices, NAND flash memory devices may experience memory cell overerasure. For example, an unselected memory cell is program-inhibited during a program operation of a NAND flash memory device by a well known self-boosting scheme. A self-boosted channel voltage of the program-inhibited memory cell is charge-shared with a channel voltage of adjacent memory cells through a memory cell acting as a channel stopper (i.e., through an overeased memory cell). This means the self-boosted channel voltage drops. As a result, the program-inhibited memory cell may be soft-programmed. This problem may occur at a NAND flash memory device using a floating gate transistor as well as a charge trapping flash memory transistor.

SUMMARY

We describe a NAND flash memory device including a memory cell array formed on a substrate including a plurality of cell strings each including a string selecting transistor, a ground selecting transistor, and plural memory cells serially coupled between the string selecting transistor and the ground selecting transistor. A high voltage generator is configured to supply a bulk voltage to the substrate and an erase control circuit is configured to stepwise increase the bulk voltage during a first period of an erase operation and to maintain the bulk voltage substantially constant during a second period of the erase operation.

And we describe a method including supplying a bulk voltage to a substrate having formed thereon a memory cell array including a plurality of cell strings each having a string selecting transistor, a ground selecting transistor, and plural memory cells serially coupled between the string selecting transistor and the ground selecting transistor. The method includes stepwise increasing the bulk voltage during a first period of an erase operation and maintaining the bulk voltage substantially constant during a second period of the erase operation.

BRIEF DRAWINGS DESCRIPTION

A more complete appreciation of the present invention, and many of the attendant advantages thereof, will become readily apparent as the same becomes better understood by reference to the following detailed description when considered in conjunction with the accompanying drawings. In the drawings, like reference symbols indicate the same or similar components:

DETAILED DESCRIPTION

The preferred embodiment of the invention will be more fully described with reference to the attached drawings.

Figure 1:
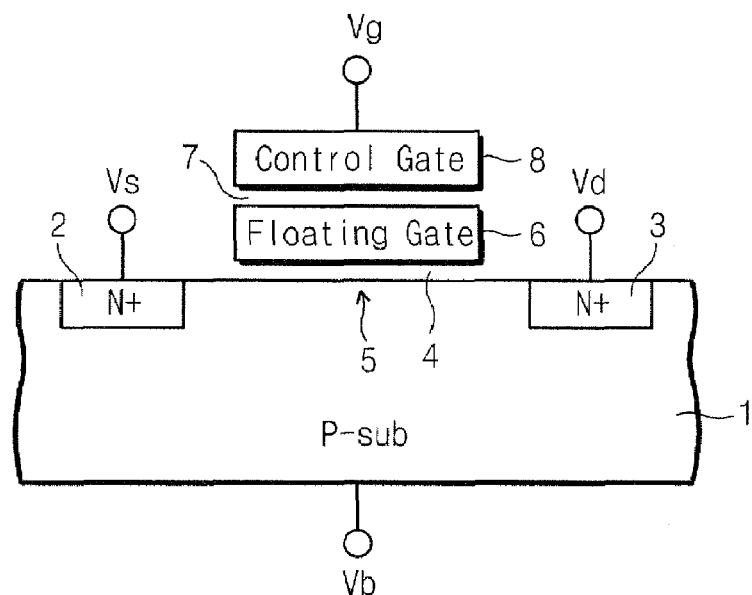
FIG. 1 is a cross-sectional view of a conventional flash memory cell.
Figure 2:
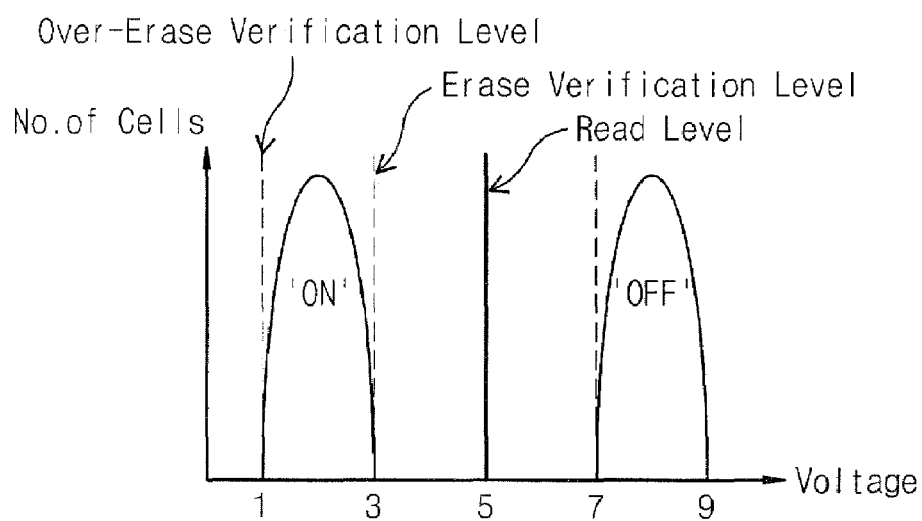
FIG. 2 is a diagram showing threshold voltage distributions for on and off cells.
Figure 3:
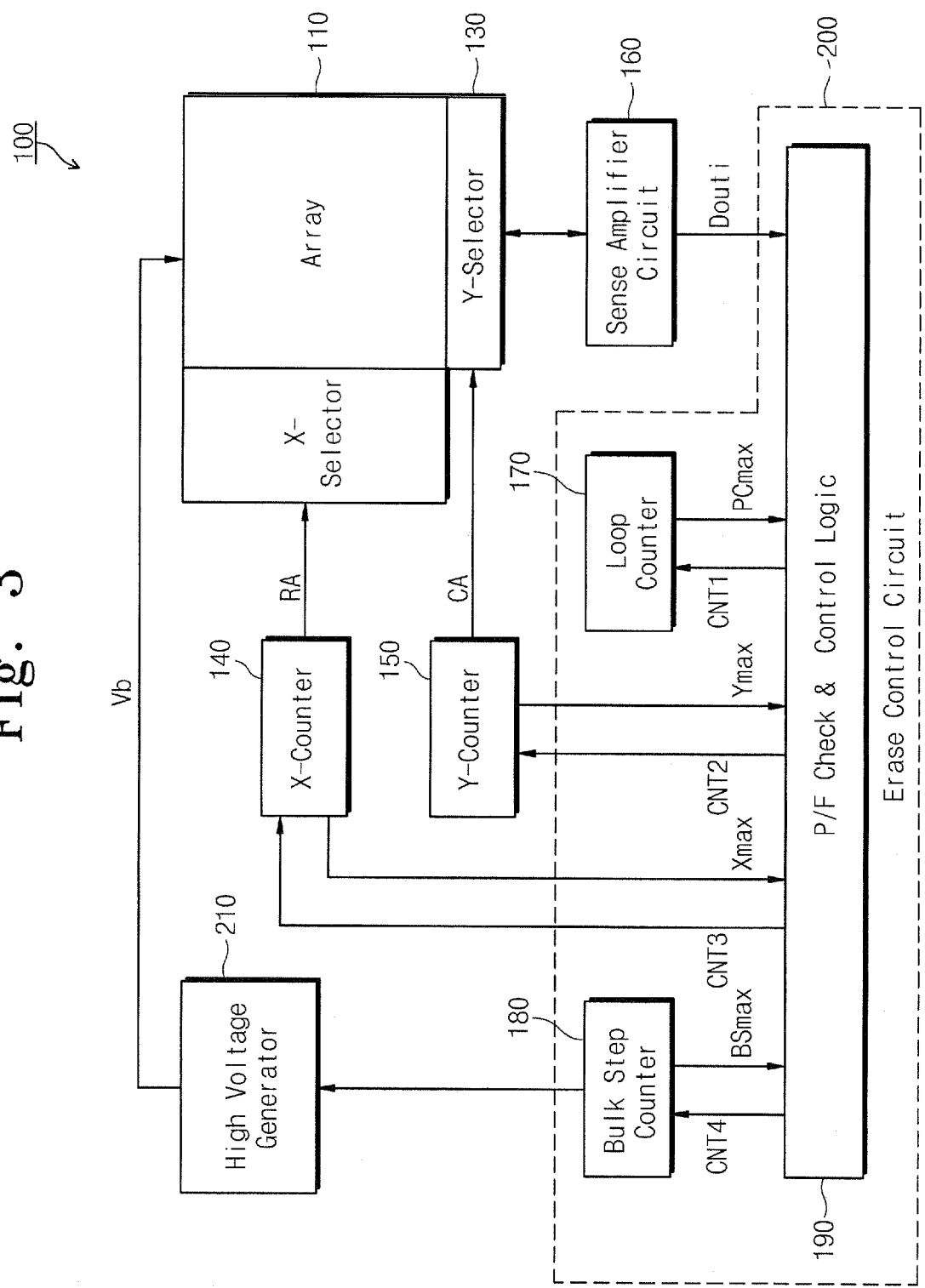
FIG. 3 is a block diagram of a flash memory device.

Referring to FIG. 3, a flash memory device is illustrated in block form. The flash memory device 100 includes an array 110 of flash memory cells having the same structure as illustrated in FIG. 1. The flash memory cells are arranged in a matrix of rows and columns. Although not illustrated in the drawing, it should readily apparent to a person of skill in the art that a plurality of wordlines and a plurality of bitlines extend along the rows and the columns, respectively. The flash memory cells in the array 110 are formed on a single bulk or substrate such that they are simultaneously erased.

The cell array 110 shown in FIG. 3 corresponds to a sector or a block. A NOR-type flash memory device having a sector or block architecture is disclosed in A 3.3V-only 16 Mb Flash Memory with Row-Decoding Scheme by Kang-Deog Suh, IEEE International Solid-State Circuits Conference, vol. 2, pp. 42-43 (1996) which is hereby expressly incorporated by reference.

The NOR-type flash memory device disclosed in the Suh reference includes an array divided into a plurality of sectors or blocks. The bulk regions of each sector are electrically isolated from each other. All cells integrated in each sector are simultaneously erased during the above-described erase operation. Each sector corresponds to an erase unit, the wordlines and the bitlines in one sector being selected separately from those in other sectors. Such a structure allows a disturbance-free program/erase operation resulting in high reliability.

Continuing to refer FIG. 3, the flash memory device 100 further includes row selecting circuit 120, column selecting circuit 130, X-counter 140, Y-counter 150, and sense amplifier circuit 160. The row selecting circuit 120 selects a wordline in the cell array 110 responsive to row address RA generated by the X-counter 140. The row selecting circuit 120 supplies the selected wordline with a wordline voltage required for any of a number of operations such as program/erase/read/erase verification/erase repair operations.

The column selecting circuit 130 selects bitlines of a byte or word unit responsive to column address CA generated by the Y-counter 150. The column selecting circuit 130 supplies the selected bitlines with current and voltage (e.g., drain voltage) needed for any of a number of operations (e.g., program operation). The sense amplifier circuit 160 detects states (e.g., whether a cell is on or off) cells selected by the row and column selecting circuits 120 and 130, respectively.

The flash memory device 100 of FIG. 3 further includes an erase control circuit 200 for controlling the erase operation. The erase control circuit 200 includes a loop counter 170, a bulk step counter 180, and a pass/fail check & control logic 190, as will be more fully described below. During the erase operation, a high voltage generator 210 is provided in the flash memory device 100 for generating a bulk voltage Vb provided to the bulk (or substrate) under the control of the erase control circuit 200.

Figure 4:
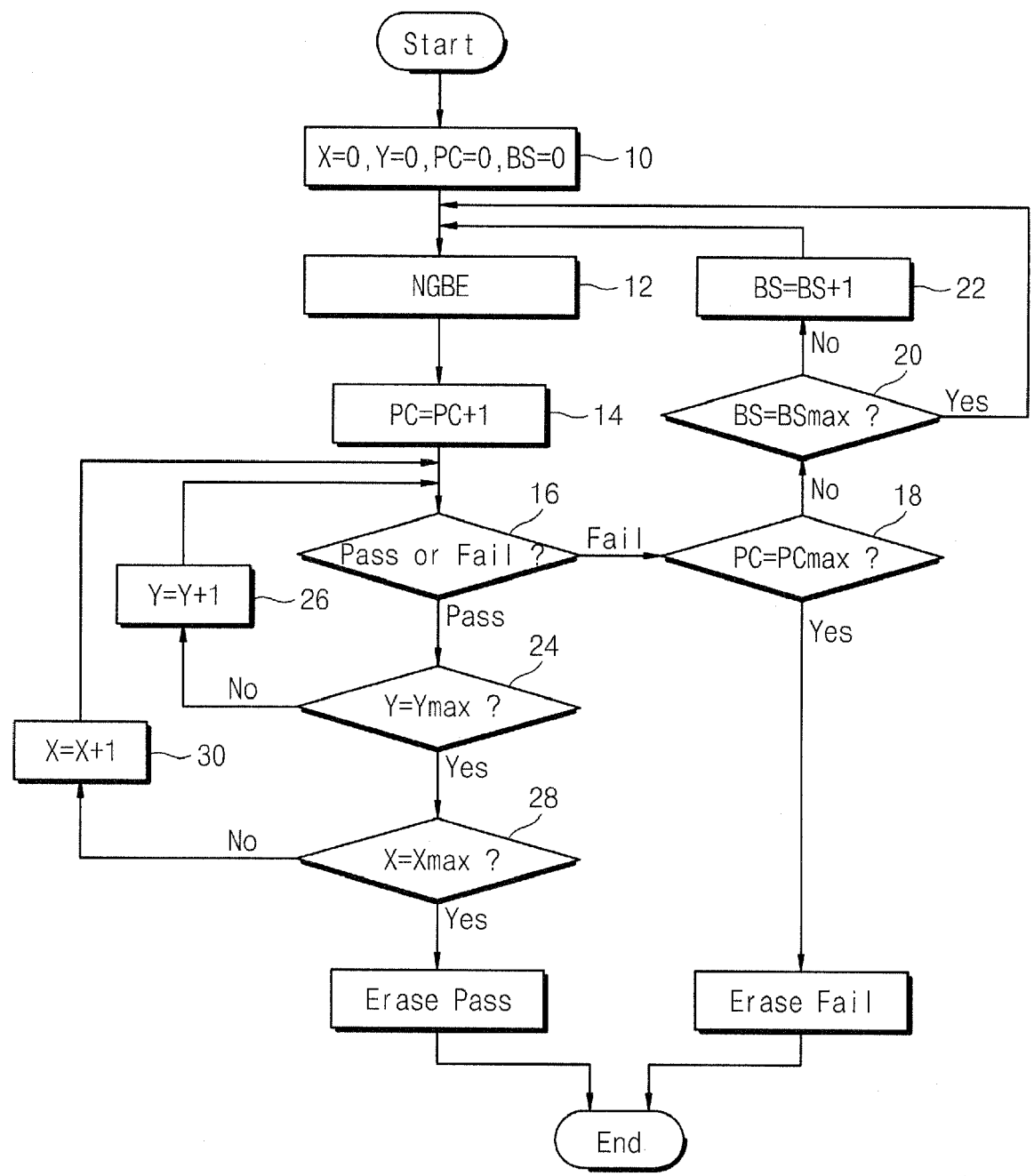
FIG. 4 is a flowchart of an erase operation.
Figure 5:
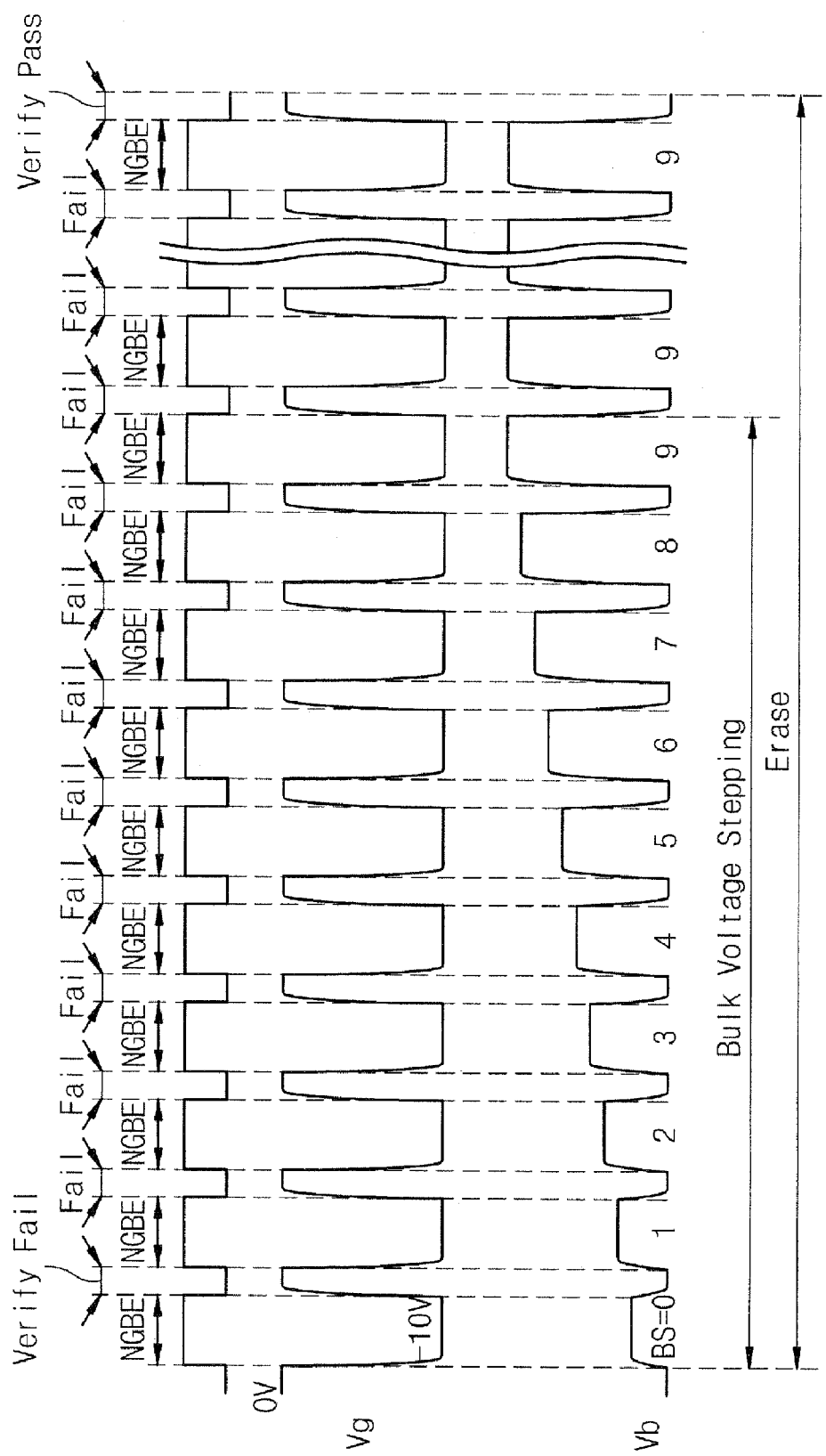
FIG. 5 is a diagram of bulk voltage fluctuations relevant to FIG. 4.

FIG. 4 is a flowchart of the erase operating of the flash memory device in FIG. 3. FIG. 5 shows the fluctuation of the bulk voltage Vb when the erase operation of FIG. 4 is applied to the device of FIG. 3. As described above, the flash memory cells in a given sector are simultaneously erased using the NGBE erase verification and erase repair operations. The erase repair operation is the same as the described previously and will not be further described.

At step 10, the values X, Y, PC, and BS of the X-counter 140, the Y-counter 150, the loop counter 170, and the bulk step counter 180, respectively, are reset to zero. At the step 12, the NGBE operation is performed under the following bias condition: a voltage Vg of −10V is applied to the control gates of all flash memory cells in the sector (or wordlines therein), and a voltage Vb of +6V is applied to the bulk (substrate). As a result of the bias condition, the electric field is formed across the floating gate of each cell. At step 14 the value PC of the loop counter 170 is incremented by "1" responsive to the control signal CNT1 generated by the P/F check & control logic circuit 190.

After a predetermined time under that NGBE bias condition (e.g., Vg =−10V, Vb=+6V), the erase verification operation is carried out under the following verification bias condition, e.g., Vg=+3V, Vd=+5V, Vs=0V, and Vb=0V. The verification operation checks whether the threshold voltages of flash memory cells selected by the initially set row and column addresses are distributed in the target threshold voltage range (+1V to +3V). As is well known to those skilled in the art, the erase verification operation is carried out in the same manner as the read operation except that the bias condition of the erase verification operation is different from that of the read operation. During erase verification, data Douti (the value of i is determined by the byte or word unit) read out by the sense amplifier circuit 160 is transferred to the control logic 200.

The P/F check & control logic 200 checks whether the threshold voltages of the selected flash memory cells are lower than the maximum value (e.g., +3V) of the target threshold voltage range (step 16). If at least one of the selected cells has its threshold voltage higher than the maximum value, the P/F check & control logic 200 checks whether the value PC of the loop counter 170 is equal to its maximum value PCmax (step 18). When the value PC is equal to the maximum value PCmax, the erase operation ends as an erase fail.

On the other hand, when the value PC is less than the maximum value PCmax, the value BS of the bulk step counter 180 is checked to determine whether it is equal to its maximum value BSmax (step 20). If the value BS is less than the maximum value BSmax, the value BS is incremented by 1 responsive to the control signal CNT4 from the P/F check & control logic 190 (step 22). The erase operation then returns to step 12. As the bulk step counter 180 is incremented, as illustrated in FIG. 5, the bulk voltage Vb is increased by a predetermined amount. The increase forces the electric field across the floating gates of all flash memory cells to be increased. If the value BS is not equal to the maximum value BSmax, the value BS is not incremented before the NGBE operation is executed at step 12.

If the selected memory cells have their threshold voltages equal to or less than the maximum value (+3V) of the target threshold voltage range corresponding to the on cell (step 16) the P/F check & control logic 190 checks whether or not the value Y of the Y-counter 150 is equal to its maximum value Ymax (step 24). If the value Y is less than the maximum value Ymax, the value Y is incremented by 1 responsive to the control signal CNT2 from the P/F check & control logic 190. Steps 16, 24, and 26 are repeated until the value Y reaches the maximum value Ymax. If the value Y is equal to the maximum value Ymax, the value X is checked to determine whether it has reached the maximum value Xmax (step 28). If the value X is less than the maximum value Xmax, the value X is incremented by 1 the control signal CNT3 generated by the P/F check & control logic 190 (step 30). The steps 16, 24, 28, and 30 are repeated until the value X is equal to the maximum value Xmax. If the value X is equal to the maximum value Xmax, the erase operation ends as erase pass.

The erase algorithm shown in FIG. 4, if the maximum value BSmax of the bulk step counter 180 is, for example, 9, the bulk voltage Vb is increased by the predetermined voltage step by step until the value BS reaches the maximum value BSmax=9V. The bulk voltage Vb supplied to the bulk during the NGBE operation, as illustrated in FIG. 5, is maintained constant (e.g., +9V) after the value BS reaches the maximum value (e.g., 9V).

When the value BS of the bulk step counter 180 is less than the maximum value BSmax, e.g., 5V,5, some of the flash memory cells in the sector 10 may have their threshold voltages distributed in the on state threshold voltage range. In this case, after increasing the bulk voltage Vb by the predetermined voltage, the NGBE operation is carried to shift the threshold voltages of the remaining flash memory cells into the target threshold voltage range. Since the bulk voltage Vb is increased, the strength of the electric field across the floating gate of each cell is increased. The increased electric field, in turn, increases the erase speed of the respective flash memory cells. For example, when the electric field is increased by 1V, the erase speed is a few times faster. Therefore, the threshold voltages of the sufficiently erased cells may be distributed below the minimum value (+1V) of the target threshold voltage range owing to the increase of the electric field that corresponds to the increased bulk voltage Vb. That is, the flash memory cells are overerased, resulting in an increased total erase time.

Figure 6:
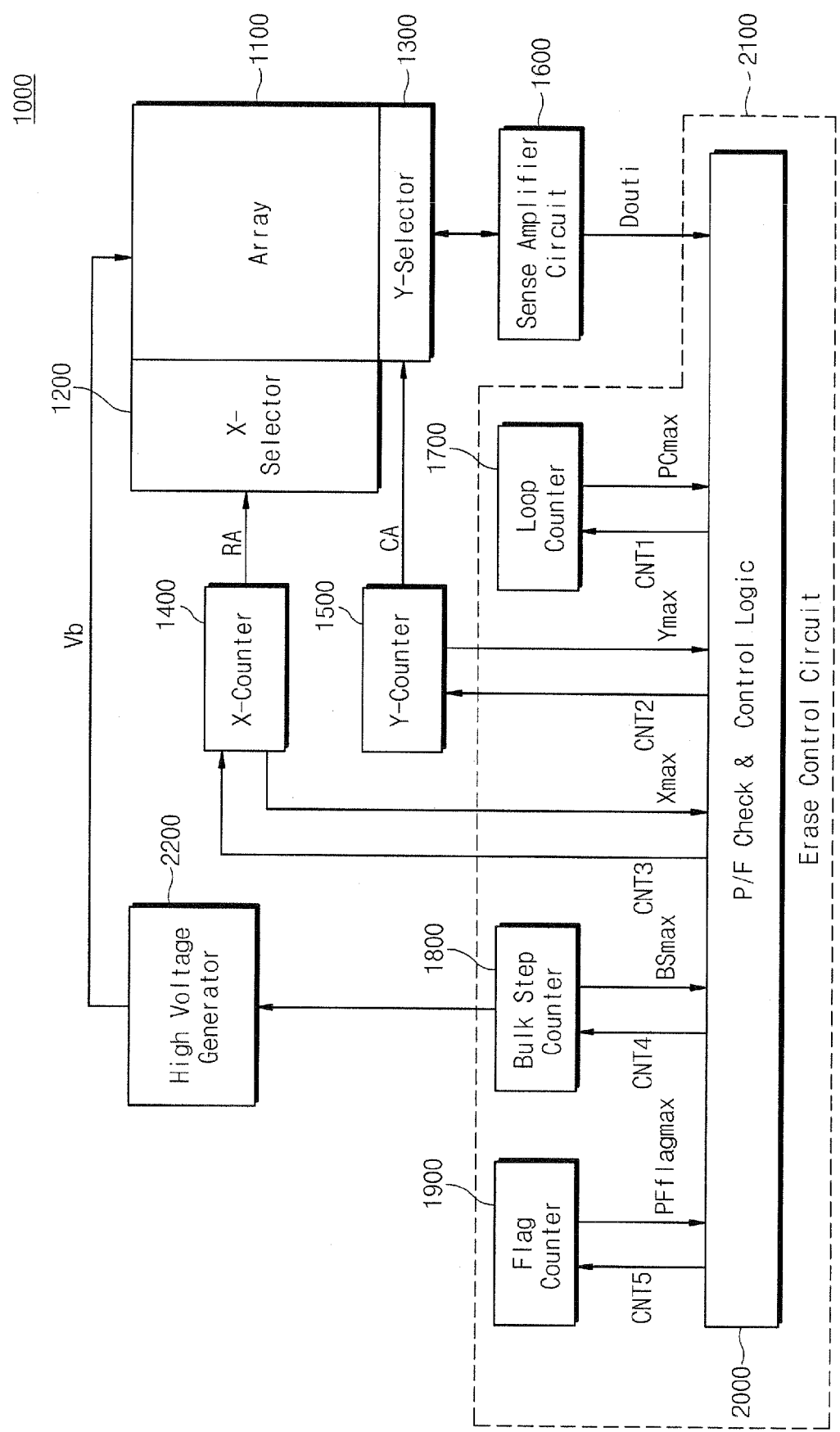
FIG. 6 is a block diagram of a flash memory device according to the present invention.

Referring to FIG. 6, a flash memory device according to the present invention is illustrated. The flash memory device 1000 includes an array 1100, row and column selecting circuits 1200 and 1300, respectively X-counter 1400, Y-counter 1500, sense amplifier circuit 1600, and high voltage generator 2200, operates similarly to analogous blocks shown in FIG. 3. The operation of the array 1100, row and column selecting circuits 1200 and 1300, respectively, Xcounter 1400, Y-counts 1500, sense amplifier 1600 and voltage generator 2000, therefore, will not be described in further detail.

The flash memory device 1000 further includes an erase control circuit 2100. The erase control circuit 2100 includes a loop counter 1700, a bulk step counter 1800, a flag counter 1900, and a pass/fail check & control logic 2000. The constituent elements of the erase control circuit 2100 will be more fully described below.

Figure 7:
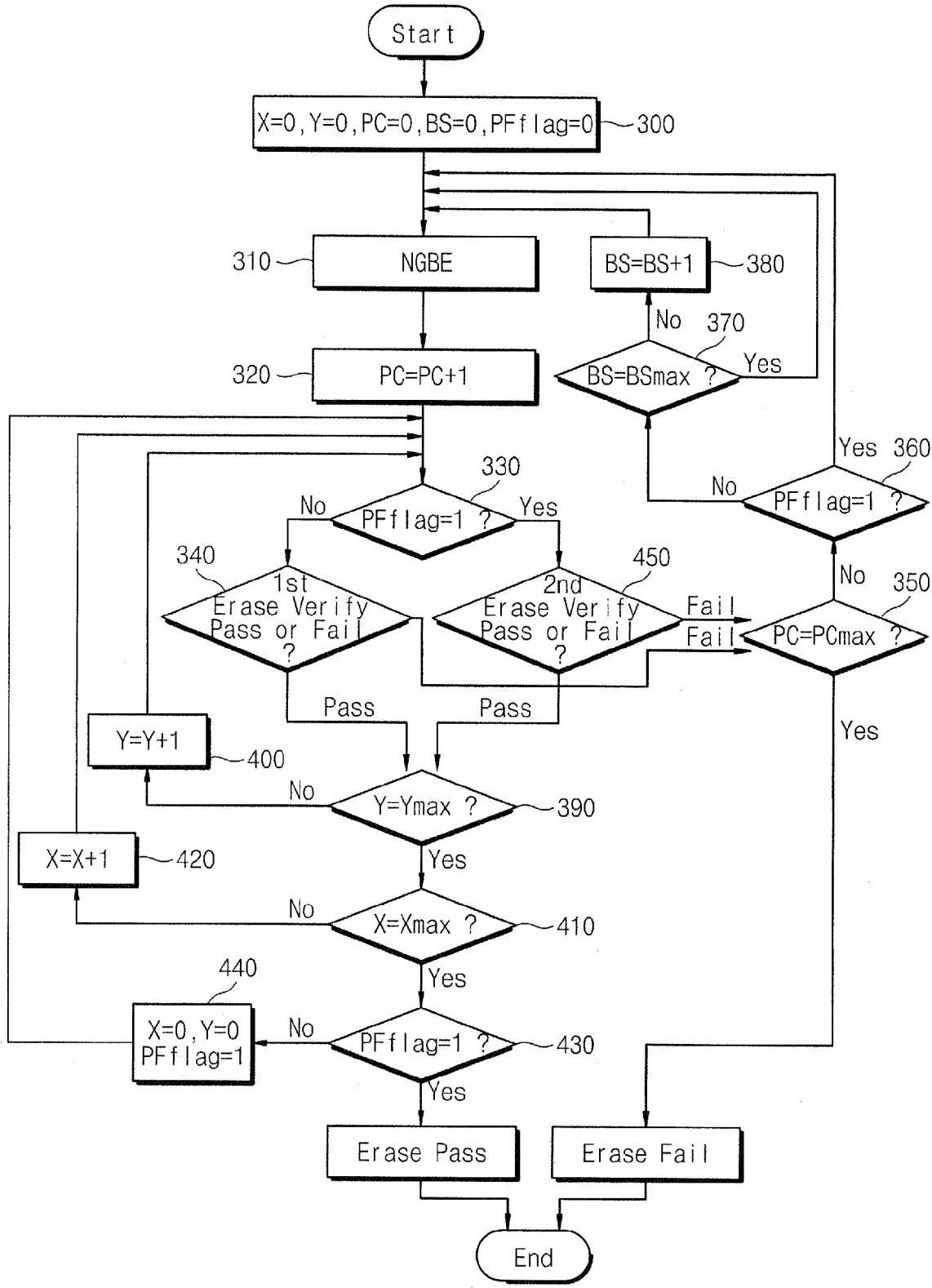
FIG. 7 is a flowchart of an erase operation according to an embodiment of the present application.
Figure 8:
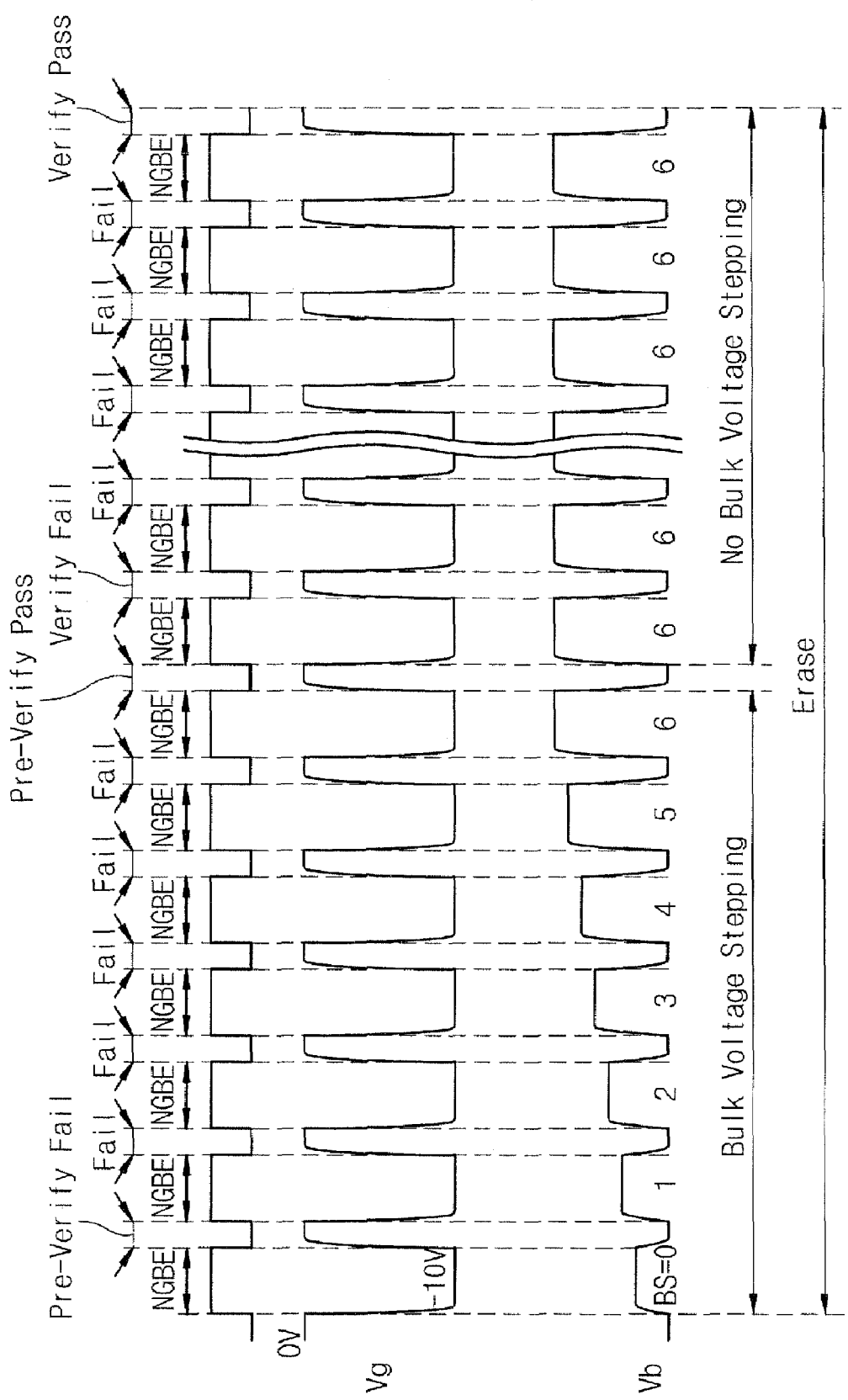
FIG. 8 is a diagram of bulk voltage fluctuations relevant to FIG. 7.

FIG. 7 is a flowchart for describing the erase procedure according to an embodiment of the present invention. FIG. 8 is a diagram showing the bulk voltage fluctuation relevant to FIG. 7.

At step 300, the values X, Y, PC, BS and PFflag of the X-counter 1400, the Y-counter 1500, the loop counter 1700, the bulk step counter 1800, and the flag counter 1900 are reset to 0. At step 310, the NGBE operation is carried out by applying a voltage Vg of −10V to the wordlines, and a Vb of +6V to the bulk. At step 320, the value PC of the loop counter 1700 is incremented 1 responsive to the control signal CNT1 from the P/F check & control logic 2000. At step 330, the P/F check & control logic 2000 checks whether the value PFflag of the flag counter 1900 is 1.

If the value of the flag counter 1900 is not 1, the erase verification operation is carried out to check whether flash memory cells selected by initially set row and column addresses have their threshold voltages equal to or less than a predetermined pre-verify voltage V.sub.PRE.sub..sub.—sub.VERI (e.g., +4V) (step 340). Hereinafter, the erase verification operation is termed "a pre erase verification operation". The pre-verify voltage V.sub.PRE.sub..sub.—.sub.VERI is set to have its voltage level higher than the maximum value (e.g., +3V) of the target threshold voltage range corresponding to the on state. The pre erase verification operation is carried out under the condition that the pre-verify voltage V.sub.PRE.sub..sub.—.sub.VERI of e.g., +4V is applied to a selected wordline, the voltage Vd of +5V is applied to selected bitlines, and a ground voltage (e.g., 0V) is applied to the sources of the selected cells. During the pre erase verification operation, data Douti read out by the sense amplifier circuit 1600 is transferred to the P/F check & control logic 2000.

At step 340, the P/F check and control logic 2000 checks whether the threshold voltages of the selected flash memory cells are equal to or less than the pre-verify voltage V.sub-.PRE.sub..sub.—.sub.VERI. If at least one of the selected cells has its threshold voltage less than the pre-verify voltage V.sub.PRE.sub..sub.—.sub.VERI, the value PC is checked against the maximum value PCmax (step 350). If the value PC reaches the maximum value PCmax, the erase procedure ends as an erase fail. When the value PC is less than the maximum value PCmax, the value PFflag of the flag counter 1900 is checked against 1 (step 360). If the value PFflag is not 1, steps 370 and 380 are carried in the same manner as those of the process shown in FIG. 3 so that the bulk voltage Vb is increased by a predetermined voltage. Doing so increases the electric field across the flash memory cells in the sector during the subsequent NGBE operation (step 310).

Returning to step 340, if the threshold voltages of the selected cells are equal to or less than the pre-verify voltage V.sub.PRE.sub..sub.—.sub.VERI, the procedure goes to the step 390, in which the value Y of the Y-counter 1500 is incremented by 1. Steps 330, 340, 390, and 400 are repeated until the value Y reaches the maximum value Ymax. When the value Y is equal to the maximum value Ymax, the value X of the X-counter 1400 is compared to its maximum value Xmax (step 410). When the value X is less than the maximum value Xmax, the value X of the X-counter 1400 is incremented by 1 (step 420). Steps 330, 340, 390, 410, and 420 are repeated until the value X reaches the maximum value Xmax. If the value X of the X-counter 1400 is equal to the maximum value Xmax, the procedure goes to the step 430. At step 430, the value PFflag of the flag counter 1900 is checked against 1. If PFflag does not equal 1, the counters 1400 and 1500 are reset and the value PFflag of the flag counter 1900 is set to 1 (step 440). At step 330, the value PFflag is compared to 1.

Successively, the erase verification operation is carried out to check whether the flash memory cells selected by row and column addresses from the reset counters 1400 and 150 have their threshold voltages equal to or less than the maximum value (e.g., +3V) of the target threshold voltage range (step 450). Hereinafter, the maximum value is named "an erase-verify voltage". The erase verification operation is carried out under the following bias condition: a voltage Vg of +3V is applied to the selected wordline; a voltage of +5V is applied to the selected bitlines; and the ground voltage is applied to the sources of the selected cells. Data Douti read out by the sense amplifier circuit 1600 at the erase verification operation is provided into the P/F check & control logic 2100, If at least one of the selected cells has its threshold voltage higher than the erase verification voltage of about +3V, the value PC is compared to its maximum value PCmax (step 350). When PC=PCmax, the erase procedure ends as an erase fail. On the other hand, when PC<PCmax, the value PFflag is compared to 1 (step 360). As set forth above, since the value PFflag of the flag counter 1900 is set to 1 at the step 440, the procedure goes to the step 310, in which the NGBE operation is carried out without incrementing the bulk voltage Yb. That is, the NGBE operation is carried out using a bulk voltage Vb that is the same as that used in the pre erase verification operation. The bulk voltage Vb is maintained constant resulting in a constant strength electric field across the floating gate of each cell.

As described above, while the pre erase verification operation is performed, the bulk voltage Vb is increased step by step. That is, as illustrated in FIG. 8, the bulk voltage Vb is increased by the predetermined voltage step by step during the NGBE operation performed until the threshold voltages of all flash memory cells in the sector 1100 reach the pre-verify voltage V.sub.PRE.sub..sub.—.sub.VERI. If the threshold voltages of all of the flash memory cells are equal to the pre-verify voltage V.sub.PRE.sub..sub.—.sub-.VERI, the NGBE operation is carried out without incrementing the bulk voltage Vb, that is, under a constant bulk voltage Vb.

Figure 9A:
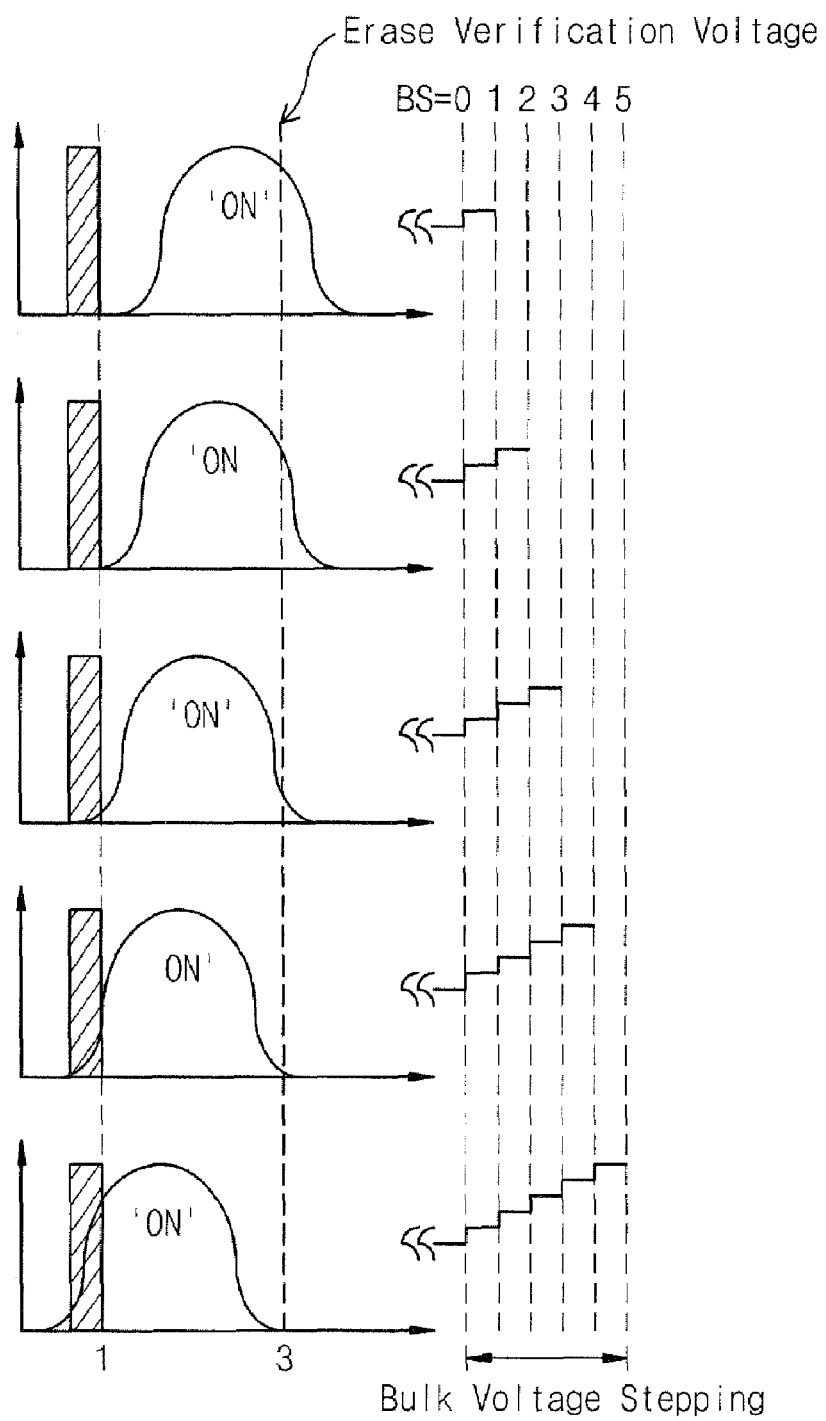
FIGS. 9A-9B are diagrams for comparing a threshold voltage distribution of an erased memory cell of the present invention with a threshold voltage distribution of an erased memory cell for the device shown in FIG. 3.
Figure 9B:
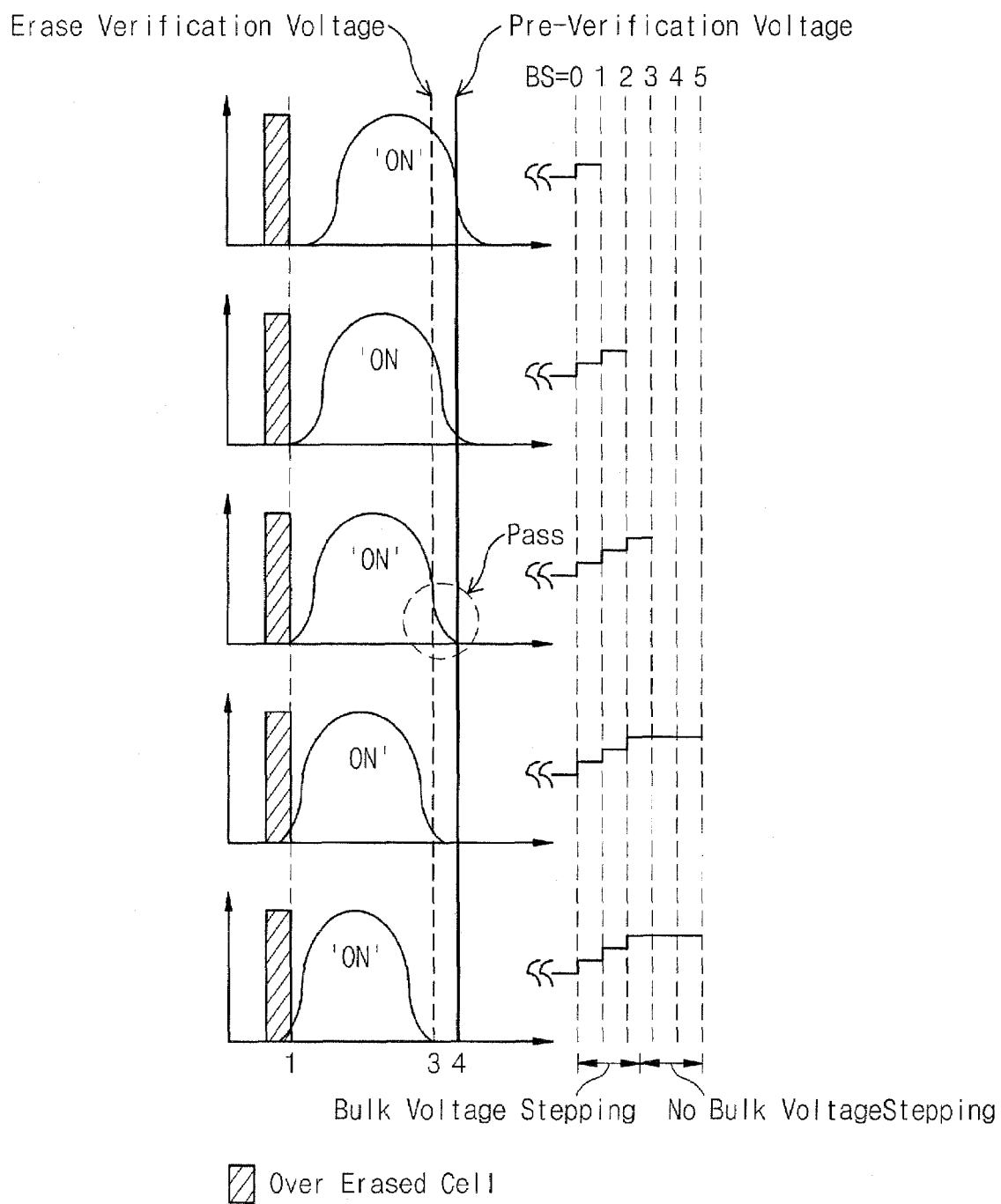

Fluctuations of the threshold voltage distribution according to the present invention are illustrated in FIG. 9. According to the erase algorithm of the present invention for increasing the bulk voltage Vb at the pre erase verification operation and for maintaining the bulk voltage Vb constant after the pre erase verification operation, as illustrated in FIG. 9, the flash memory cells are prevented (or suppressed) from being overerased as compared with the erase algorithm shown in FIG. 3 using as an erase verification voltage the maximum value (e.g., +3V) of the target threshold voltage range corresponding to the on state. As a result, the time required to the erase repair operation is reduced resulting in a consequent reduction in a total erase time.

Figure 10:
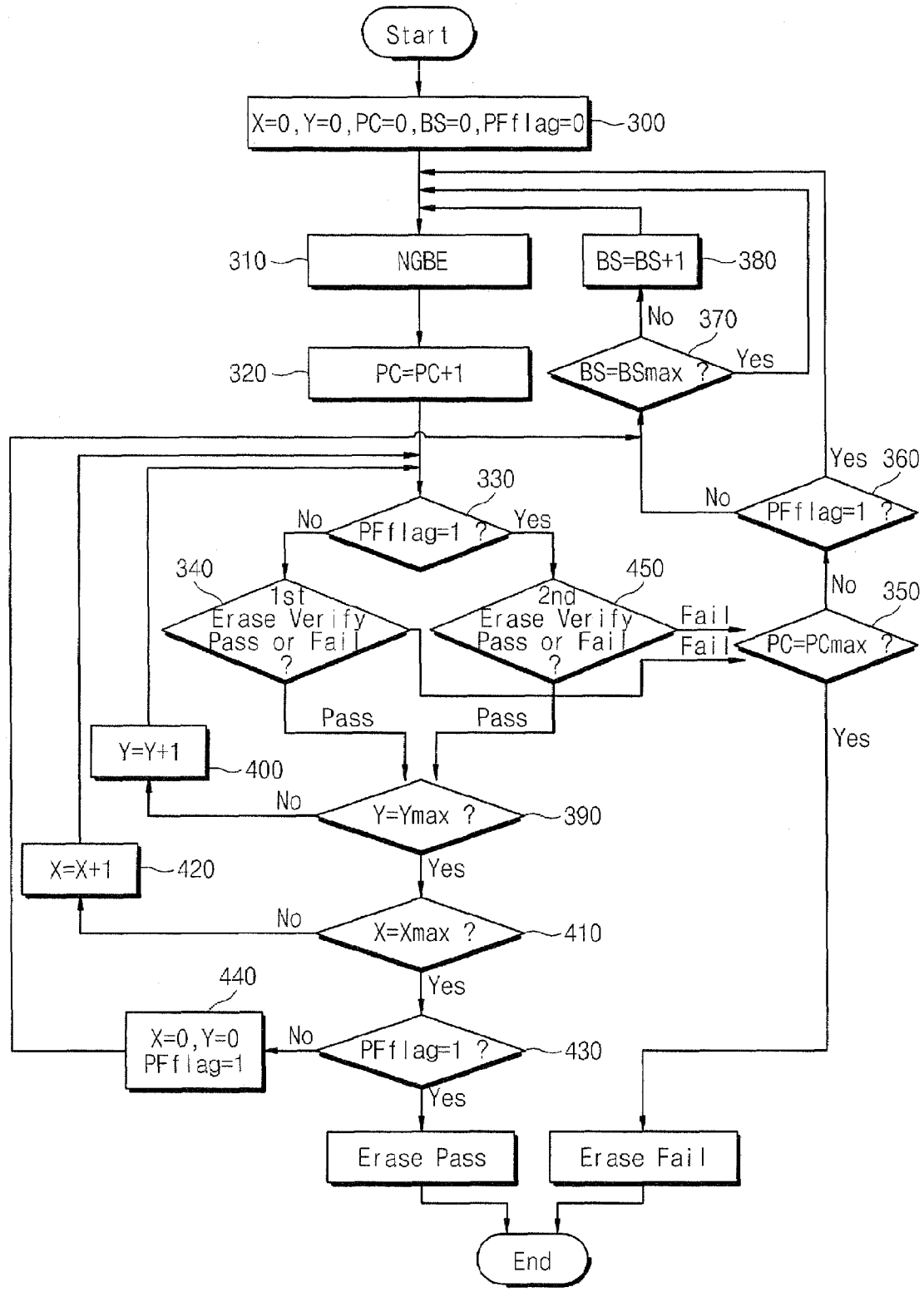
FIG. 10 is a flowchart of an erase operation according to an embodiment of the present application.
Figure 11:
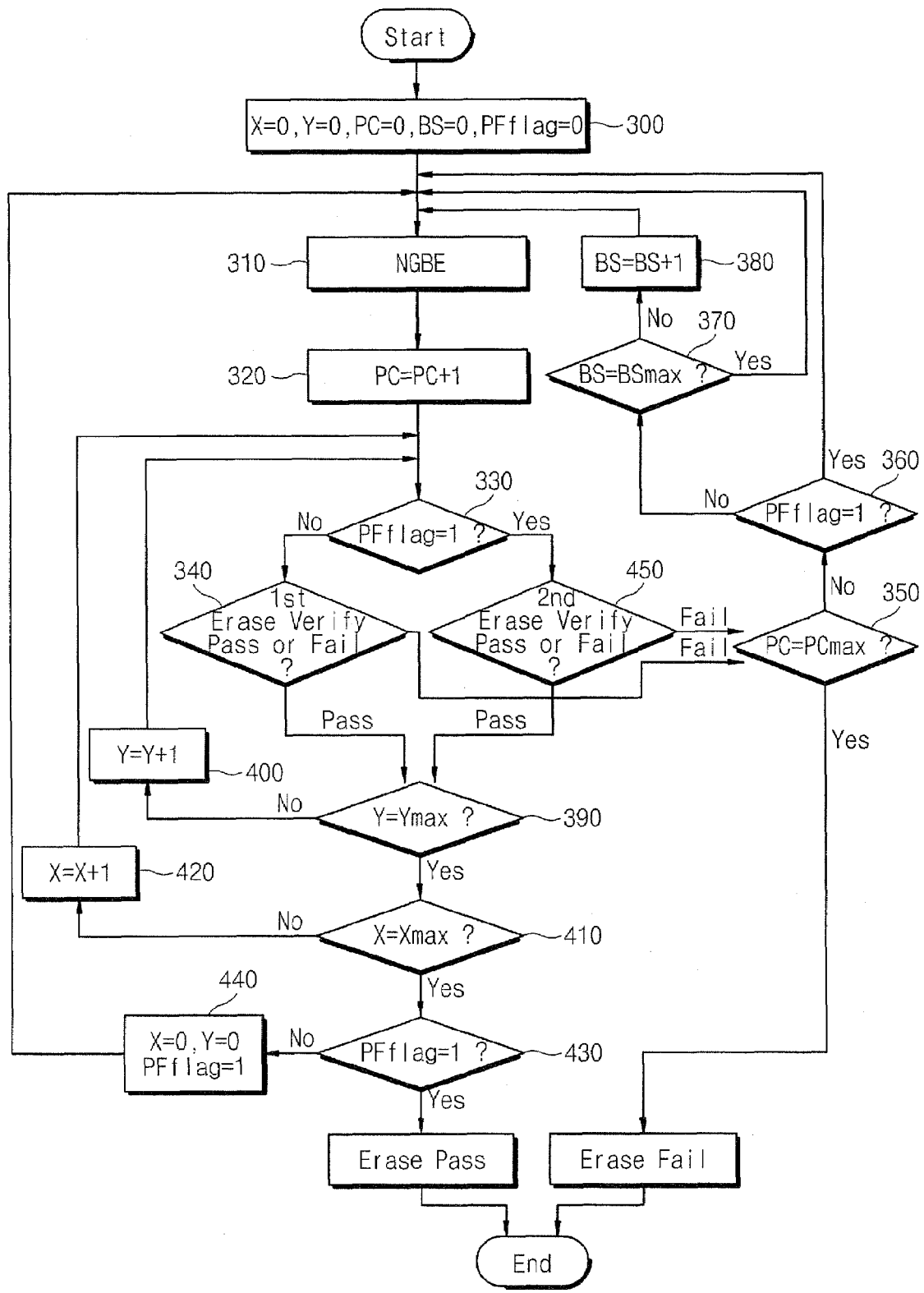
FIG. 11 is a flowchart of an erase operation according to an embodiment of the present application.

FIGS. 10 and 11 are flowcharts of other embodiments of the present invention. Boxes similarly labeled operate similarly. Referring to FIG. 10, if all of the memory cells have passed during a first interval using a first verify voltage, the method checks whether the PFflag is "1" at step 330. If the PFflag is not "1," the PFflag is set to "1" at step 440. After that, the method increases the bulk voltage of the memory cell by a predetermined voltage at box 380 after checking whether BS equals Bsmax at box 370.

Figure 12:
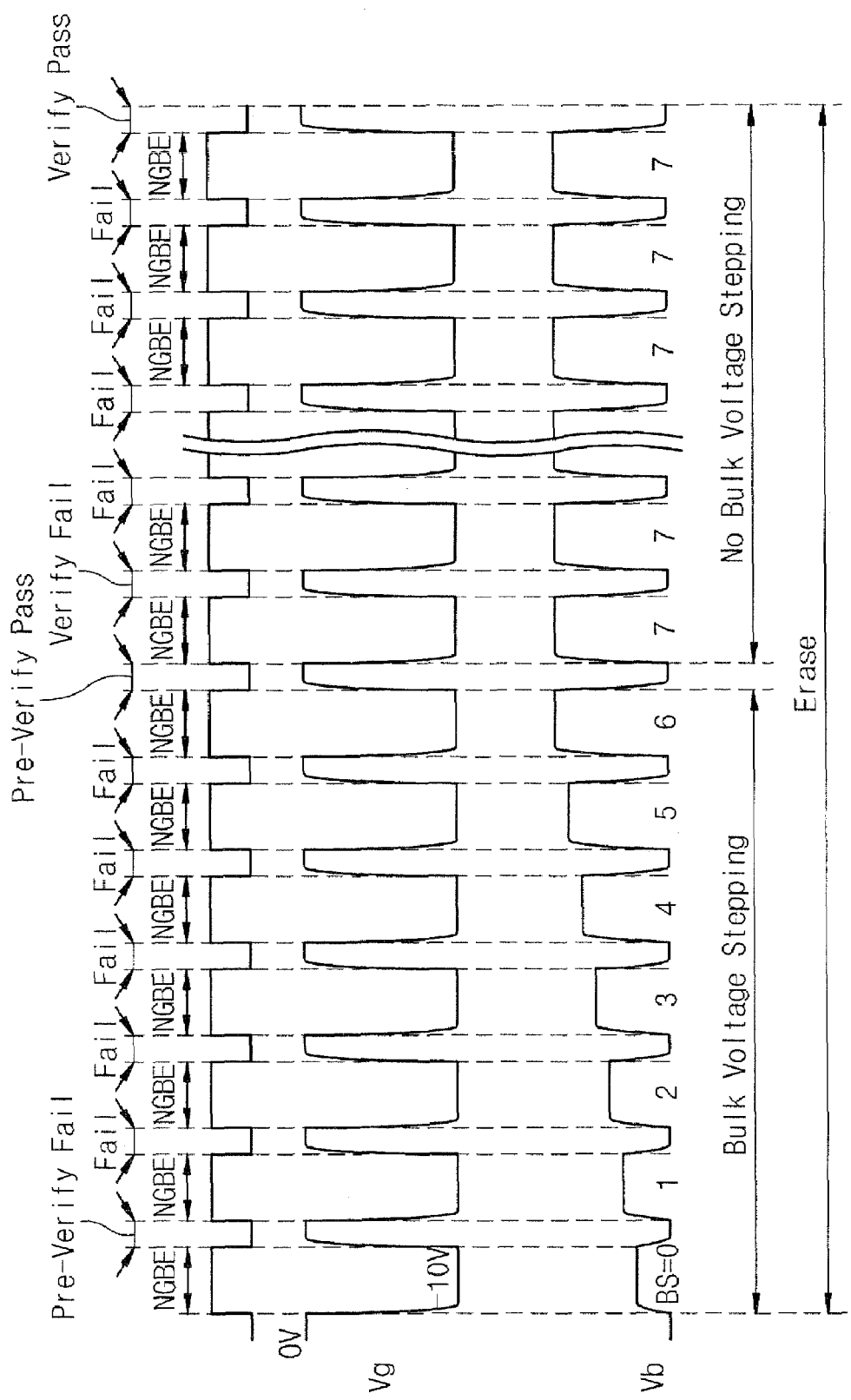
FIG. 12 is a diagram of bulk voltage fluctuations relevant to FIGS. 10 and 11.

FIG. 12 shows bulk voltage fluctuations relevant to FIG. 10.

Referring to FIG. 11, the method sets the PFflag to 1 at box 440 before returning to box 310 to do negative bulk erase NGBE without bulk stepping.

Figure 13:
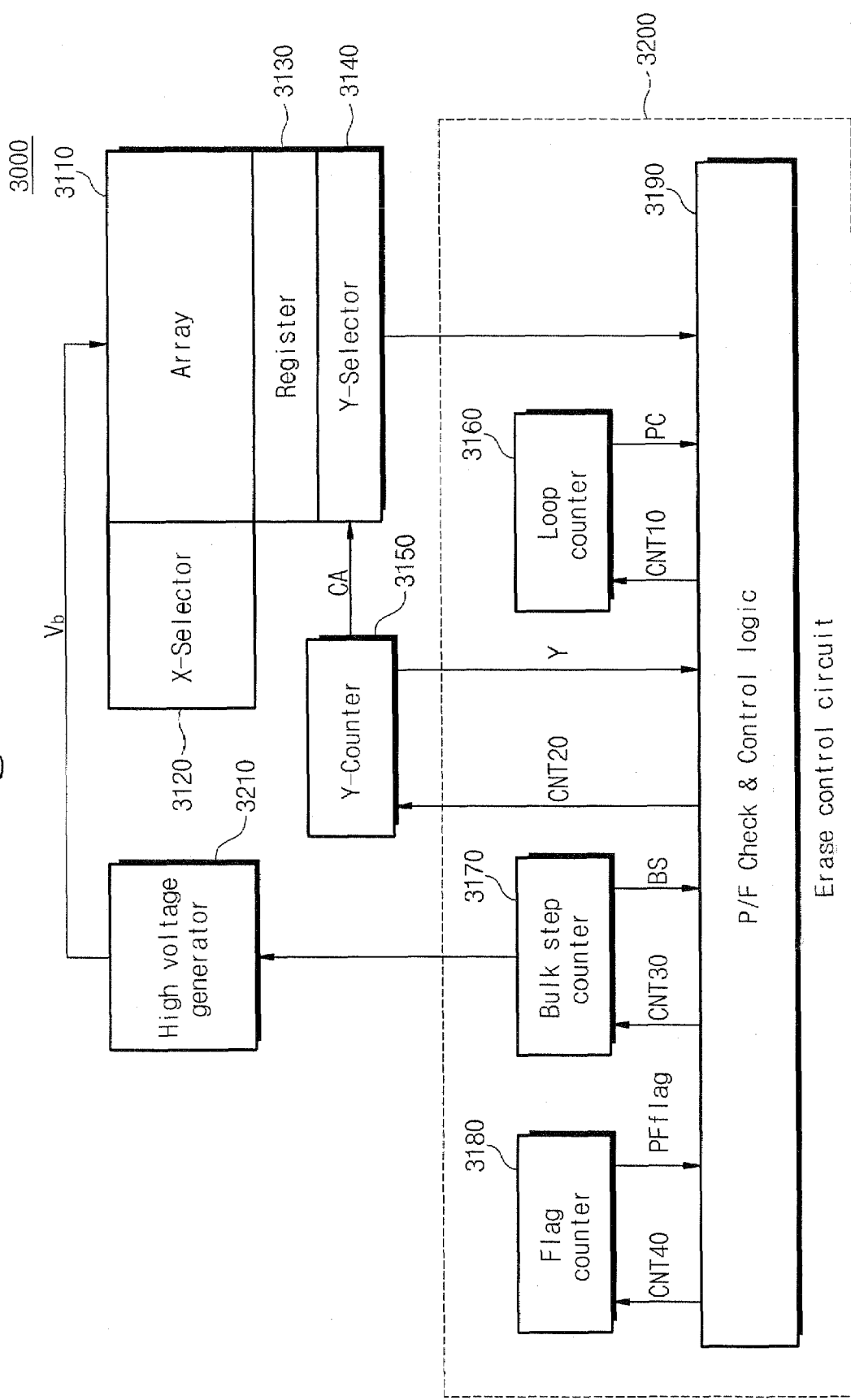
FIG. 13 is a block diagram of a flash memory device according to an embodiment of the present invention.
Figure 14:
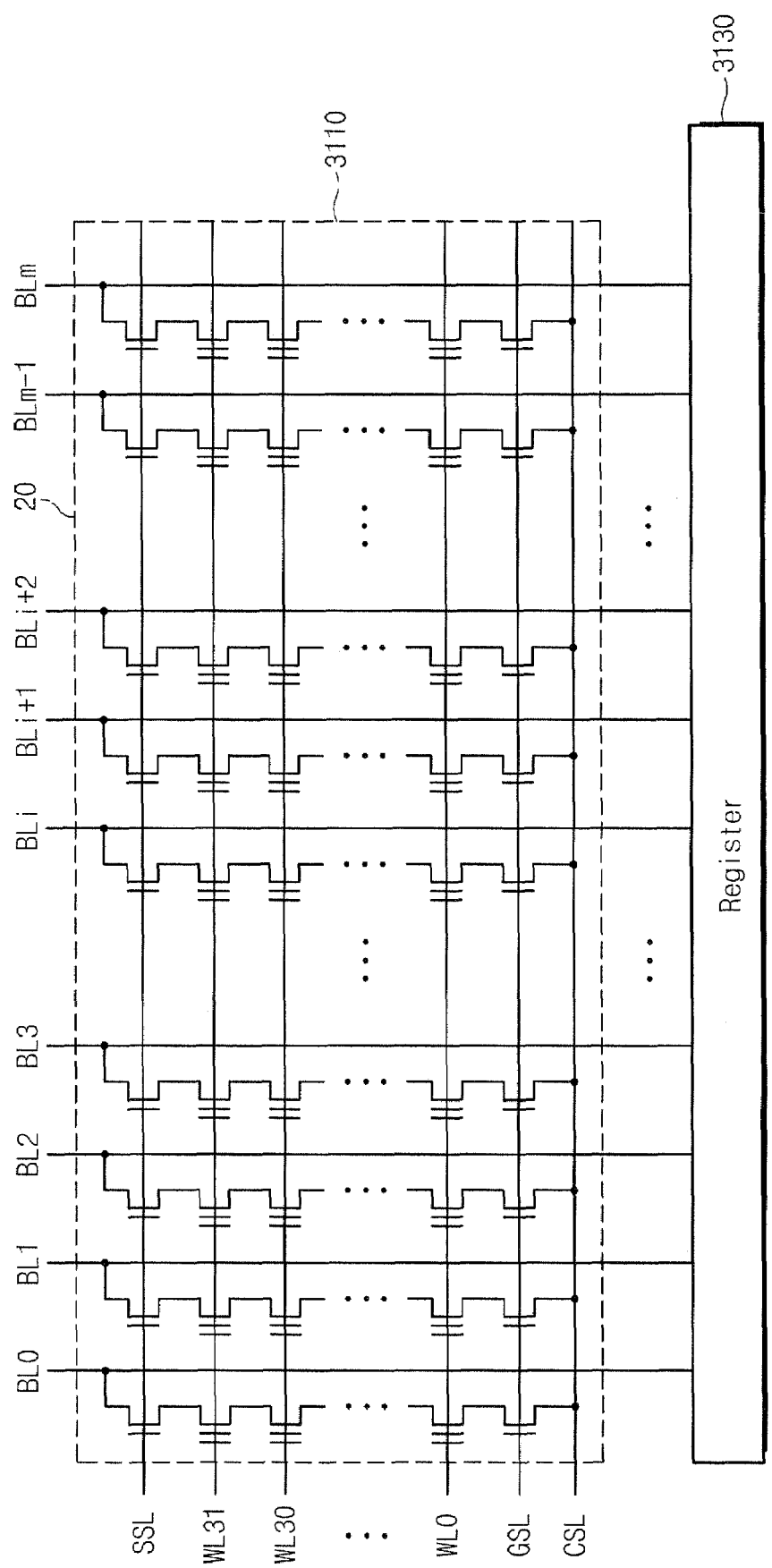
FIG. 14 is a circuit diagram of a memory cell array illustrated in FIG. 13.

FIG. 13 is a block diagram of an embodiment of a flash memory device 3000. FIG. 14 is a circuit diagram of a memory cell array illustrated in FIG. 13. It is apparent to those skilled in the art that the flash memory device 3000 is a NAND flash memory device but the present invention may be applied to other types of memory devices (e.g., FRAMs) requiring an erase operation.

Referring to FIG. 13, the flash memory 3000 includes a memory cell array 3110 in which N-bit data information (N being 1 or larger integer) is stored. The memory cell array 3110 includes a plurality of cell strings (or NAND strings) connected to their corresponding bitlines BL0-BLm, as illustrated in FIG. 14. A cell string of each column includes a string selecting transistor as a first selecting transistor, a ground selecting transistor as a second selecting transistor, and a plurality of memory cells coupled in series between the selecting transistors. A string selecting transistor of each column has a drain connected to a corresponding bitline and a gate connected to a string selecting line SSL. The ground selecting transistor has a source connected to a common source line CSL and a gate connected to a ground selecting line GSL. In each cell string, memory cells are coupled in series between a source of a string selecting transistor and a drain of a ground selecting transistor. Cells of each cell string include a floating gate transistor or a charge trapping transistor. Control gates of transistors are connected to corresponding wordlines WL31-WL0, respectively. A string selecting line SSL, wordlines WL0-WL31 and a ground selecting line GSL are electrically connected to a row selector (X-selector) 3120 illustrated in FIG. 13. A memory cell array 3110 illustrated in FIG. 14 corresponds to one memory block. However, it should be apparent to those skilled in the art that the memory cell array 3110 may include plural memory blocks.

Returning to FIG. 13, the X-selector 3120 selects one of wordlines according to row address information and supplies wordlines voltages based on operation modes to the selected wordline and unselected wordlines. Bitlines BL0-BLm arranged through the memory cell array 3110 are electrically connected to a register 3130 (called "sense and latch circuit" or "page buffer"). The register 3130 senses data from memory cells of the selected wordline through the bitlines BL0-BLm during a read operation mode and supplies a power supply voltage (alternatively termed a program-inhibited voltage) or a ground voltage (alternatively termed program voltage) to the bitlines BL0-BLm according to data to be programmed during a program operation mode, respectively. As is well known, the register 3130 includes page buffers each corresponding to their bitlines. Alternatively, the register 3130 may include page buffers that are connected to bitline pairs. In this case, each of the page buffers not only functions as we describe above, but additionally selects one of bitlines of a corresponding pair.

The column selector (Y-selector) 3140 selects page buffers (or columns) with give units in response to a column address CA from a column counter (Y-counter) 3150 and transfers data bits of the selected page buffers to an erase control circuit 3200. The Y-counter 3150 generates a column address according to the control of the erase control circuit 3200, which we will describe in detail below. A high voltage generator 3210 generates a bulk voltage to be supplied to the memory cell array 3110 during an erase operation responsive to the erase control circuit 3200. More specifically, the high voltage generator 3210 generates a bulk voltage that increases stepwise (i.e., step by step) and is maintained during the second period of an erase operation, all responsive to the erase control circuit 3200.

The erase control circuit 3200 includes a loop counter 3160, a bulk step counter 3170, a flag counter 3180, and a pass/fail check and control logic (P/F check & control logic) 3190. The loop counter 3160 counts the number of loops responsive to the P/F check & control logic 3190. An erase operation is performed through a plurality of erase loops, and each of the erase loops includes an erase period and an erase verify period. The bulk step counter 3170 counts the number of bulk steps responsive to the P/F check & control logic 3190. The flag counter 3180 counts the number of flags according to the control of the P/F check & control logic 3190 and outputs a flag signal PFflag as a result of this count. The P/F check & control logic 3190 determines whether data bits output from the Y-selector 3140 are pass data bits and controls the loop counter 3160, the bulk step counter 3170, and the flag counter 3180 accordingly as we describe in more detail later.

In this embodiment, the X-selector 3120, the register 3130, the Y-selector 3140, and the Y-counter 3150 constitute a read circuit configured to perform a read operation responsive to the erase control circuit 3200.

Figure 15:
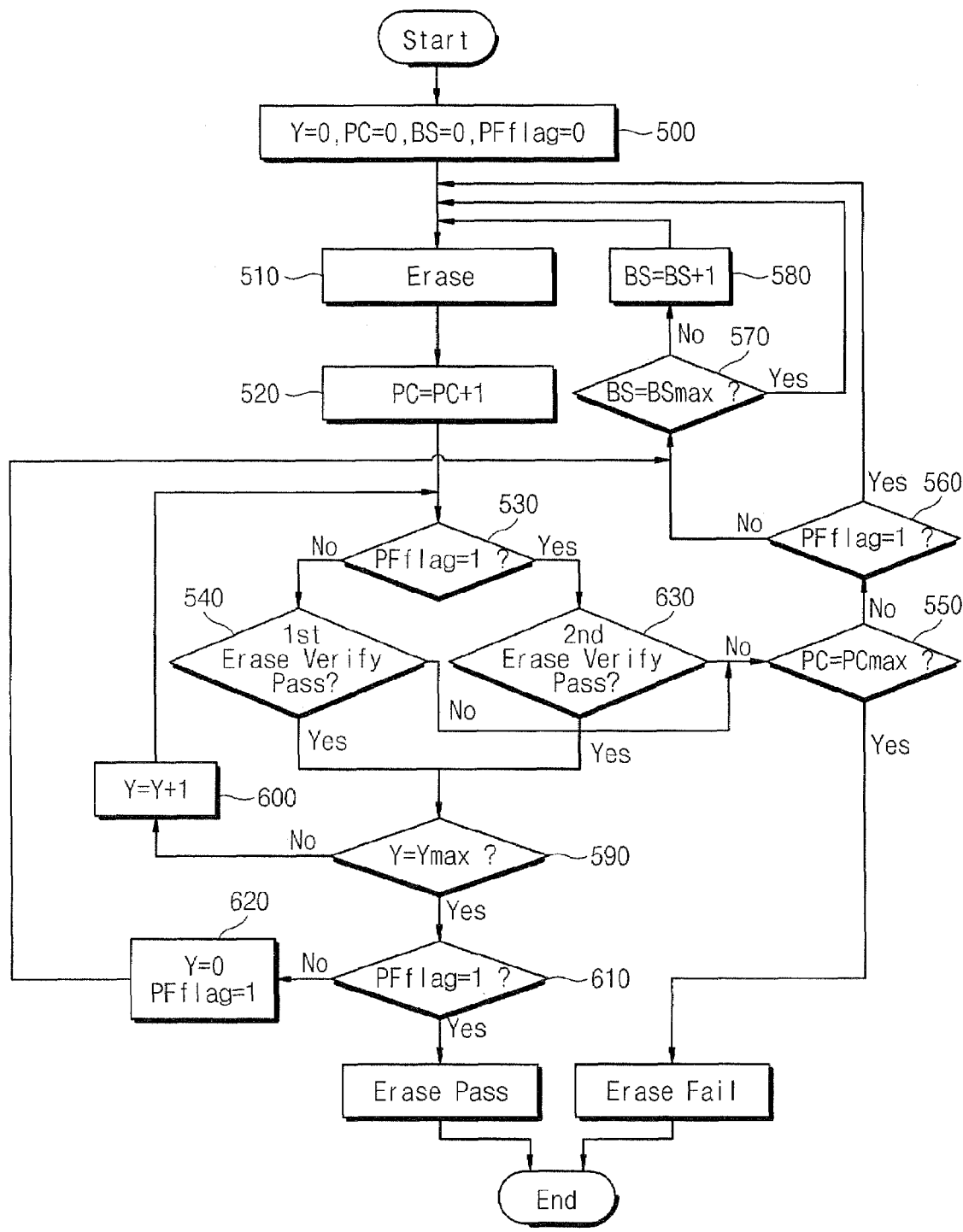
FIG. 15 is a flowchart of an embodiment of an erase method of the flash memory device illustrated in FIG. 13.
Figure 16:
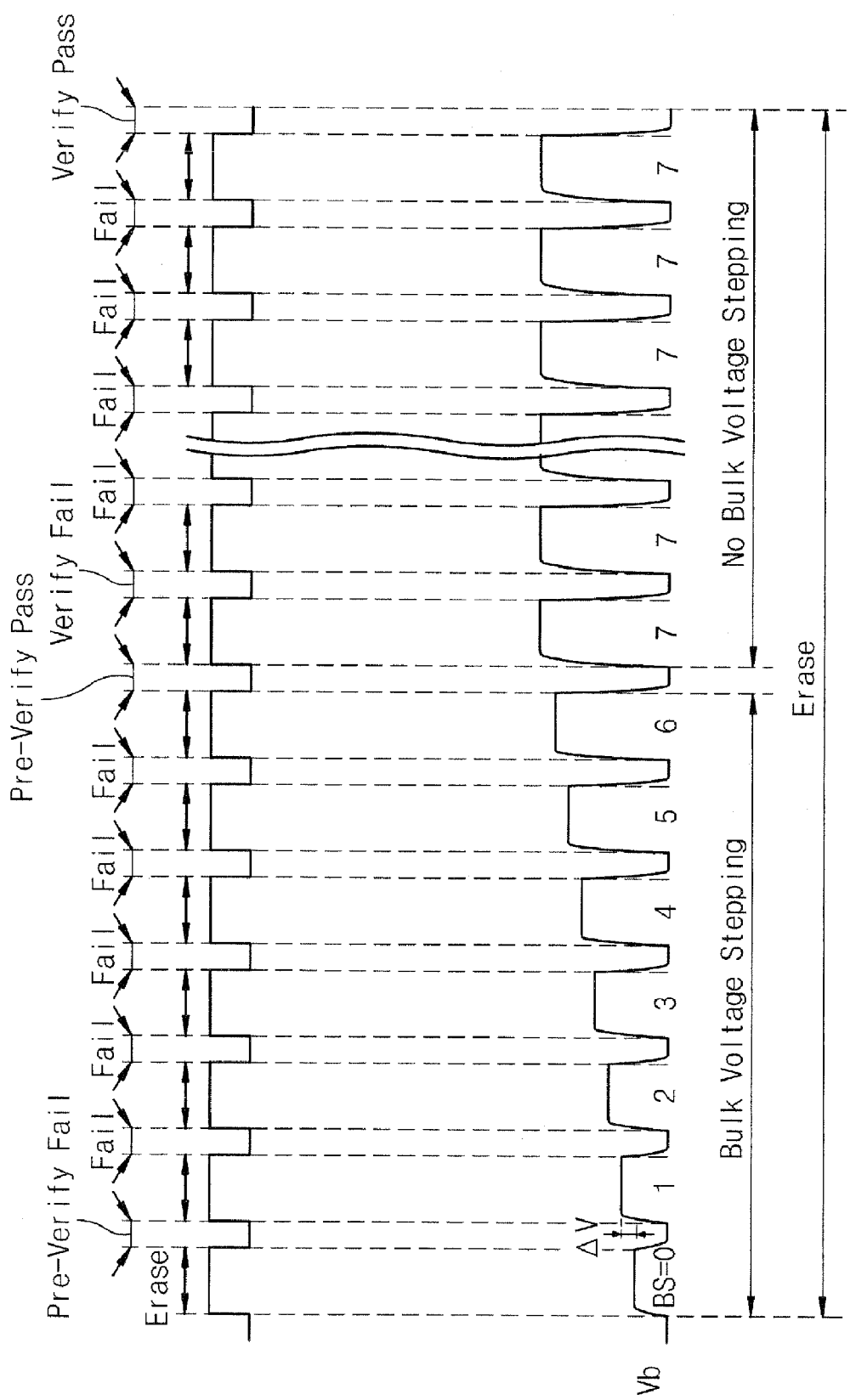
FIG. 16 shows the fluctuation of a bulk voltage according to the erase method illustrated in FIG. 15.
Figure 17A:
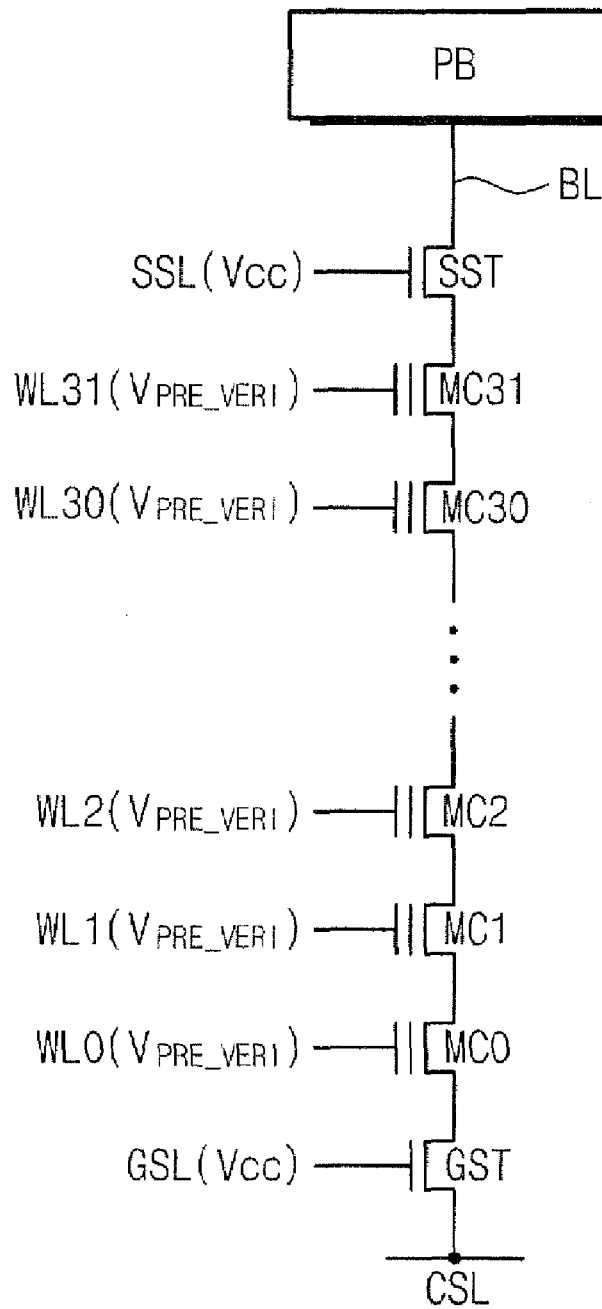
FIGS. 17A and 17B show bias conditions of wordlines during a pre-erase verify operation and an erase verify operation.
Figure 17B:
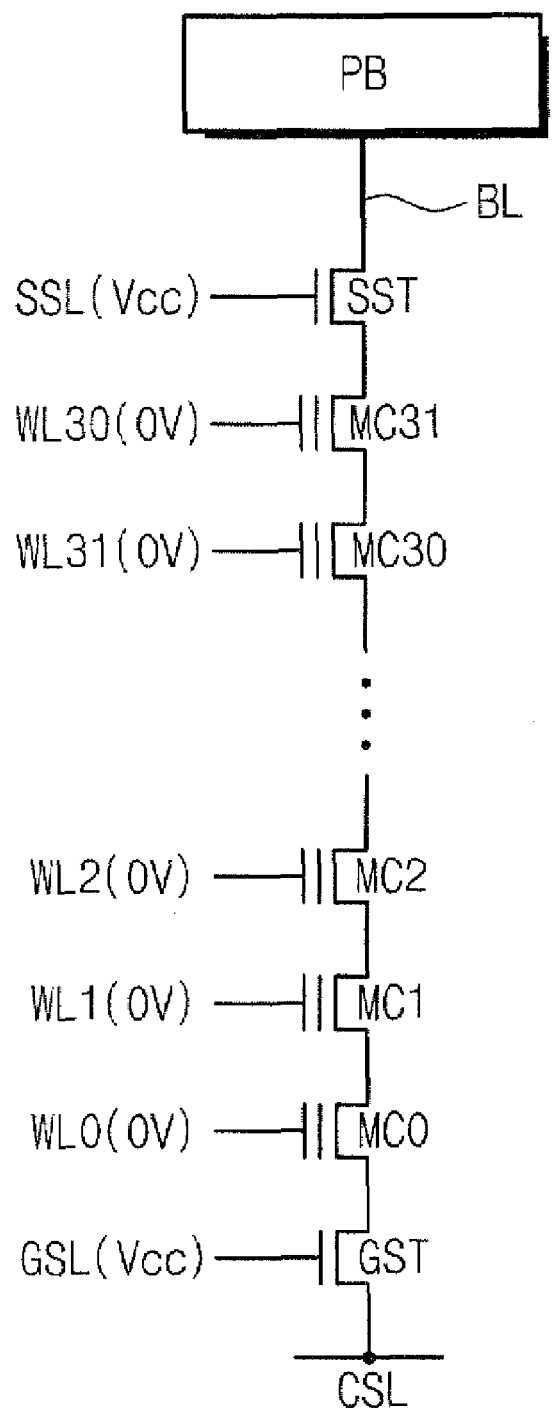

FIG. 15 is a flowchart of an embodiment of an erase method of the flash memory device illustrated in FIG. 13. FIG. 16 shows the fluctuation of a bulk voltage according to the erase method illustrated in FIG. 15. FIGS. 17A and 17B show bias conditions of wordlines during a pre-erase verify operation and an erase verify operation. Referring to FIGS. 15, 16, 17A, and 17B, at step 500, the P/F check & control logic 3190 sets a Y-counter 3150, a loop counter 3160, a bulk step counter 3170, and a flag counter 3180 to a value "0." At step 510, an erase operation is performed by applying a voltage of 0V to wordlines arranged in a memory cell array 3100 and applying a bulk voltage to a bulk or a semiconductor substrate. At this point, a string selecting line SSL and a ground selecting line GST, are driven with the voltage of 0V. At step 520, the P/F check & control logic 3190 increases a loop counter 1700's loop count value PC by "1." At step 530, the P/F check & control logic 3190 checks whether a PFflag value of the flag counter 3180 is "1."

If the value PFflag of the flag counter 3180 is not "1," the method proceeds to step 540. At step 540, an erase verify operation (hereinafter referred to as a pre-erase verify operation) verifies whether erased memory cells have a higher voltage than a preset pre-verify voltage $V_{PRE\_VERI}$. The pre-verify voltage $V_{PRE\_VERI}$ may be higher than 0V and lower than the least threshold voltage of a threshold voltage distribution corresponding to an OFF state. In the case where single-bit data is stored in a memory cell, there is only one threshold voltage distribution corresponding to the OFF state. On the other hand, in the case where multi-bit data is stored in the memory cell, there may be at least three threshold voltage distributions corresponding to the OFF state. The least threshold voltage of these threshold voltage distributions corresponding to the OFF state may define a pre-verify voltage. The pre-erase verify operation is performed by applying the pre-verify voltage $V_{PRE\_VERI}$ to wordlines WL0-WL31 and applying a power supply voltage to selected wordlines SSL and GSL. Under these bias conditions, current supplied from a page buffer PB is discharged depending on whether threshold voltages of memory cells in a cell string are lower than the pre-verify voltage $V_{PRE\_VERI}$.

For example, if at least one threshold voltage of memory cells in a cell string is higher than pre-verify voltage $V_{PRE\_VERI}$, a voltage of a bitline BL rises toward a power supply voltage because a current path is cut off between a bitline BL and a common source line CSL. The data latched by the page buffer PB is called fail data. On the other hand, if all the threshold voltages of memory cells in a cell string is lower than pre-verify voltage $V_{PRE\_VERI}$, a voltage of a bitline BL drops toward a ground voltage because a current path is formed between the bitline BL and a common source line CSL. The data latched by the page buffer PB is called pass data. According to the pre-erase verify operation, data read out by a register 3130 is partially transferred to the P/F check & control logic 3200 through a column selector (Y-selector) 3140.

If the threshold voltages of erased memory cells is not lower than a preset pre-verify voltage $V_{PRE\_VERI}$ (i.e., at least one of the data bits transferred through the Y-selector 3140 is a fail data bit), the method proceeds to step 550. At step 550, the P/F check and control logic 3200 checks whether the loop count value PC reaches the maxim value PCmax. When the loop count value PC is equivalent to the maximum value PCmax, the erase operation ends and is considered failed. On the other hand, when the loop count value PC is lower than the maximum value PCmax, the P/F check and control logic 3200 checks whether the PFflag value of the flag counter 3180 is "1" at step 560. If the PFflag value of the flag counter 3180 is "1," the method proceeds to step 510 and begins the erase operation. If the PFflag value of the flag counter 3180 is not "1," at step 570, the P/F check & control logic 3200 checks whether a bulk step count BS reaches the maximum value BSmax. If the bulk step count BS reaches the maximum value BSmax, the method proceeds to step 510 and begins the erase operation. If the bulk step count BS does not reach the maximum value BSmax, at step 580, the P/F check & control logic 3200 increases the bulk step value BS by "1." The high voltage generator 3210 generates a bulk voltage increased by a predetermined value according to the increased bulk step count value. This causes the size (intensity) of an electric field applied to both ends of a floating gate of all flash memory cells to increase during the next erase operation. Afterwards, the method proceeds to the step 510 to begin the erase operation.

At step 540, if the threshold voltages of the erased memory cells are lower than the pre-verify voltage $V_{PRE\_VERI}$, the method proceeds to step 590. At step 590, the P/F check & control logic 3200 checks whether the Y-counter 3150 reaches the maximum value Ymax. If the value Y of the Y-counter 3150 is lower than the maximum value Ymax, at step 600, the P/F check & control logic 3200 increases the Y-counter 3150 by "1." Afterwards, these steps 530, 540, 590, and 600 are repeated until the value Y of the Y-counter 3150 reaches the maximum value Ymax, i.e., until all page buffers are selected. If the value Y of the Y-counter 3150 reaches the maximum value Ymax, the method proceeds to step 610. At step 610, the P/F check & control logic 3200 checks whether the PFflag value of the flag counter 3180 is "1." If the PFflag value of the flag counter 3180 is not "1," at step 620, the P/F check & control logic 3200 initializes the value Y of the Y-counter 3150 to "0" (zero) and sets the PFflag value of the flag counter 3180 to "1." Afterwards, the method proceeds to step 570.

The loops performed before setting the value PFflag of the flag counter 3180 to "1" constitute a first period of an erase operation. For the first period, a bulk voltage Vb increases stepwise by a predetermined increment ΔV, as illustrated in FIG. 16. Since this routine proceeds to step 570 after setting the value PFflag of the flag counter 3180 to "1," a bulk voltage of the next loop increases by the predetermined increment. This means a bulk voltage of the next loop increases more by a predetermined increment than a bulk voltage Vb used in a current loop where threshold voltages of all memory cells are determined to be lower than the pre-erase verify voltage $V_{PRE\_VERI}$, as illustrated in FIG. 16.

After the foregoing pre-erase verify operation is ended, steps 510 and 520 are performed to be substantially identical to those described above. Since the value PFflag of the flag counter 3180 is set to "1," at step 530, the PFflag value of the flag counter 3180 is determined to be "1." At step 630, the P/F check & control logic 3200 performs an erase verify operation to verify whether the pre-erase verify voltage $V_{PRE\_VERI}$ of the erased memory cells is lower than an erase verify voltage (e.g., 0V). The erase verify operation is performed by applying an erase verify voltage (e.g., 0V) to wordlines WL0-WL3 and applying a power supply voltage to selected lines SSL and GSL. Under these bias conditions, the current supplied from the page buffer PB is discharged depending on whether threshold voltages of memory cells in a cell string become lower than the erase verify voltage.

For example, if at least one threshold voltage of memory cells in a cell string is higher than an erase verify voltage, a voltage of a bitline BL rises toward a power supply voltage. The data latched by the page buffer PB is called fail data. On the other hand, if all the threshold voltages of memory cells in a cell string is lower than erase verify voltage, a voltage of a bitline BL drops toward a ground voltage. The data latched by the page buffer PB is called pass data. According to the pre-erase verify operation, data read out by a register 3130 is partially transferred to the P/F check & control logic 3200 through a column selector (Y-selector) 3140.

If the threshold voltages of erased memory cells is not lower than a preset erase verify voltage (i.e., at least one of the data bits transferred through the Y-selector 3140 is a fail data bit), the method proceeds to step 550. At step 550, the P/F check and control logic 3200 checks whether a loop count value PC reaches the maxim value PCmax. When the loop count value PC is equivalent to the maximum value PCmax, the erase operation ends and is considered failed. On the other hand, when the loop count value PC is lower than the maximum value PCmax, the P/F check and control logic 3200 checks whether the PFflag value of the flag counter 3180 is "1." Since the PFflag value of the flag counter 3180 is set to "1," the method proceeds to step 510.

Returning to step 630, if the threshold voltages of the erased memory cells are determined to be lower than the erase verify voltage, the method proceeds to step 590. At step 590, the P/F check & control logic 3200 checks whether the value Y of the Y-counter 3150 is lower than the maximum value Ymax. If the value Y of the Y-counter 3150 is lower than the maximum value Ymax, at step S600, the P/F check & control logic 3200 increases the Y-counter 3150 by "1." Afterwards, the foregoing steps are repeated until the value Y of the Y-counter 3150 reaches the maximum value Ymax, i.e., until all page buffers are selected. If the value Y of the Y-counter 3150 reaches the maximum value Ymax, the method proceeds to step 610. At step 610, the P/F check & control logic 3200 checks whether the PFflag value of the flag counter 3180 is "1." Since the value PFflag of the flag counter 3180 is set to "1" at step 620, the erase operation ends and is considered passed.

The loops performed after setting the value PFflag of the flag counter 3180 to "1" constitute a second period of the erase operation. For the second period, a bulk voltage Vb does not increase stepwise by a predetermined increment but is constantly maintained.

According to the foregoing erase method, the overerasure of memory cells is suppressed to prevent problems (e.g., soft programming or programming degradation of program-in-hibited cells) which occur at a NAND flash memory device.

Figure 18:
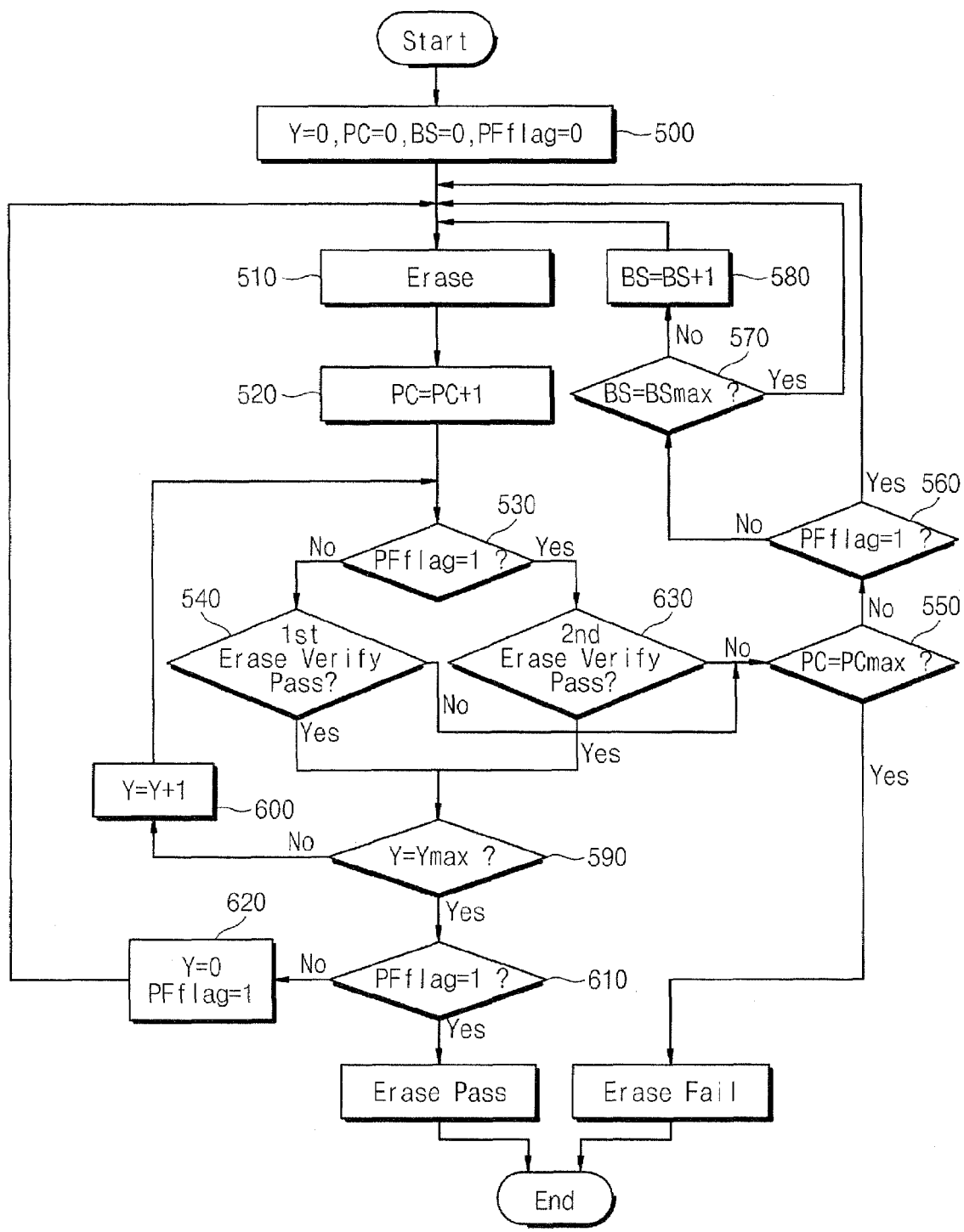
FIG. 18 is a flowchart of an embodiment of an erase method of a flash memory device according to another embodiment of the present invention.
Figure 19:
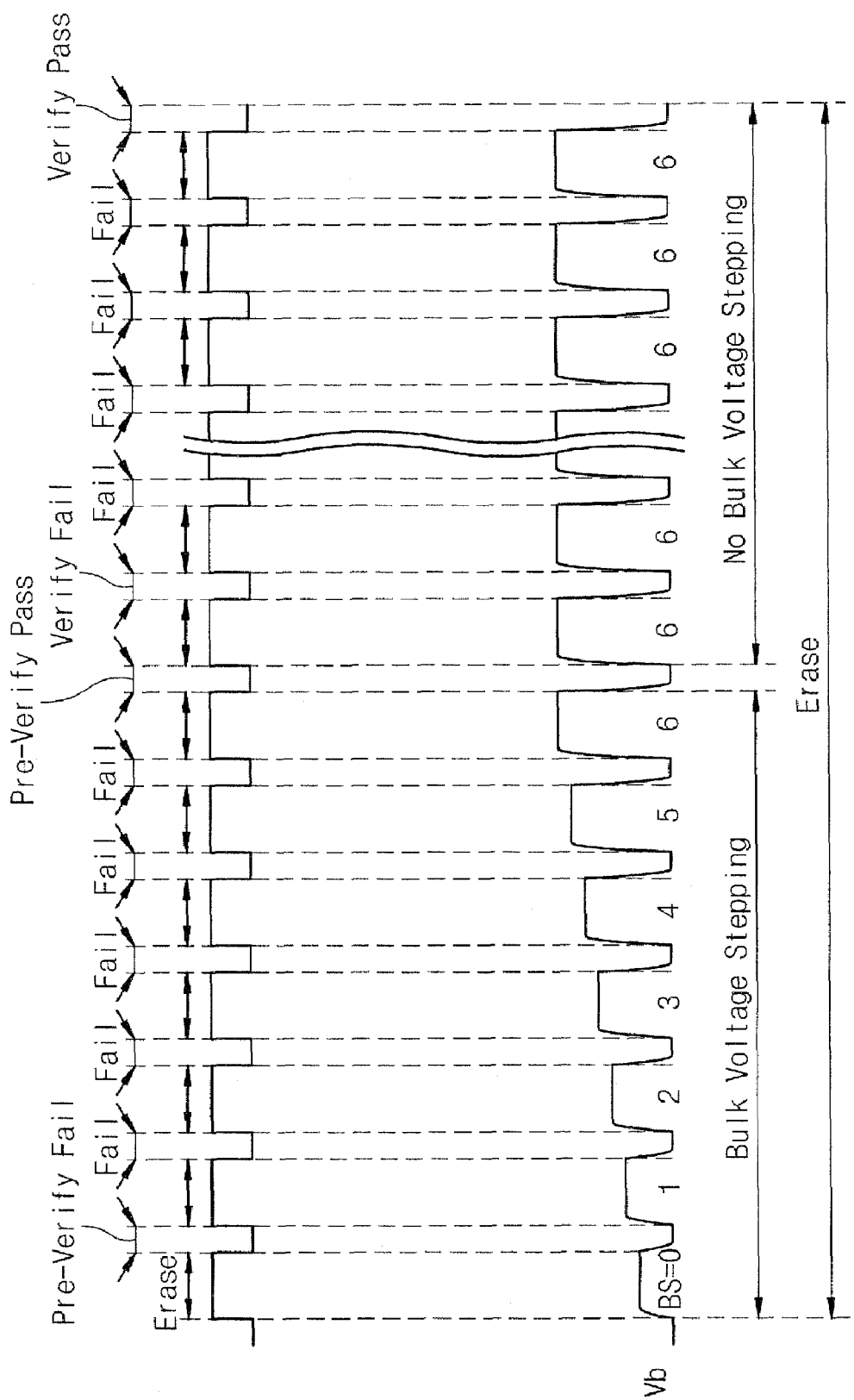
FIG. 19 shows the fluctuation of a bulk voltage according to the erase method illustrated in FIG. 18.

FIG. 18 is a flowchart illustrating an erase method of a flash memory device according to another embodiment of the present invention, and FIG. 19 shows the fluctuation of a bulk voltage according to the erase method illustrated in FIG. 18. In FIG. 18, the same steps as performed in FIG. 15 are designated by the same numerals and will not be described in further detail. The erase method illustrated in FIG. 18 is substantially identical to that illustrated in FIG. 15 except that step 510 is performed following step 620. According to the erase method illustrated in FIG. 18, an erase operation is performed at step 510 after setting the value PFflag of the flag counter 3180 to "1". This means the erase operation is performed without increase of a bulk voltage Vb after a first period of the erase operation ends, as illustrated in FIG. 19.

Figure 20:
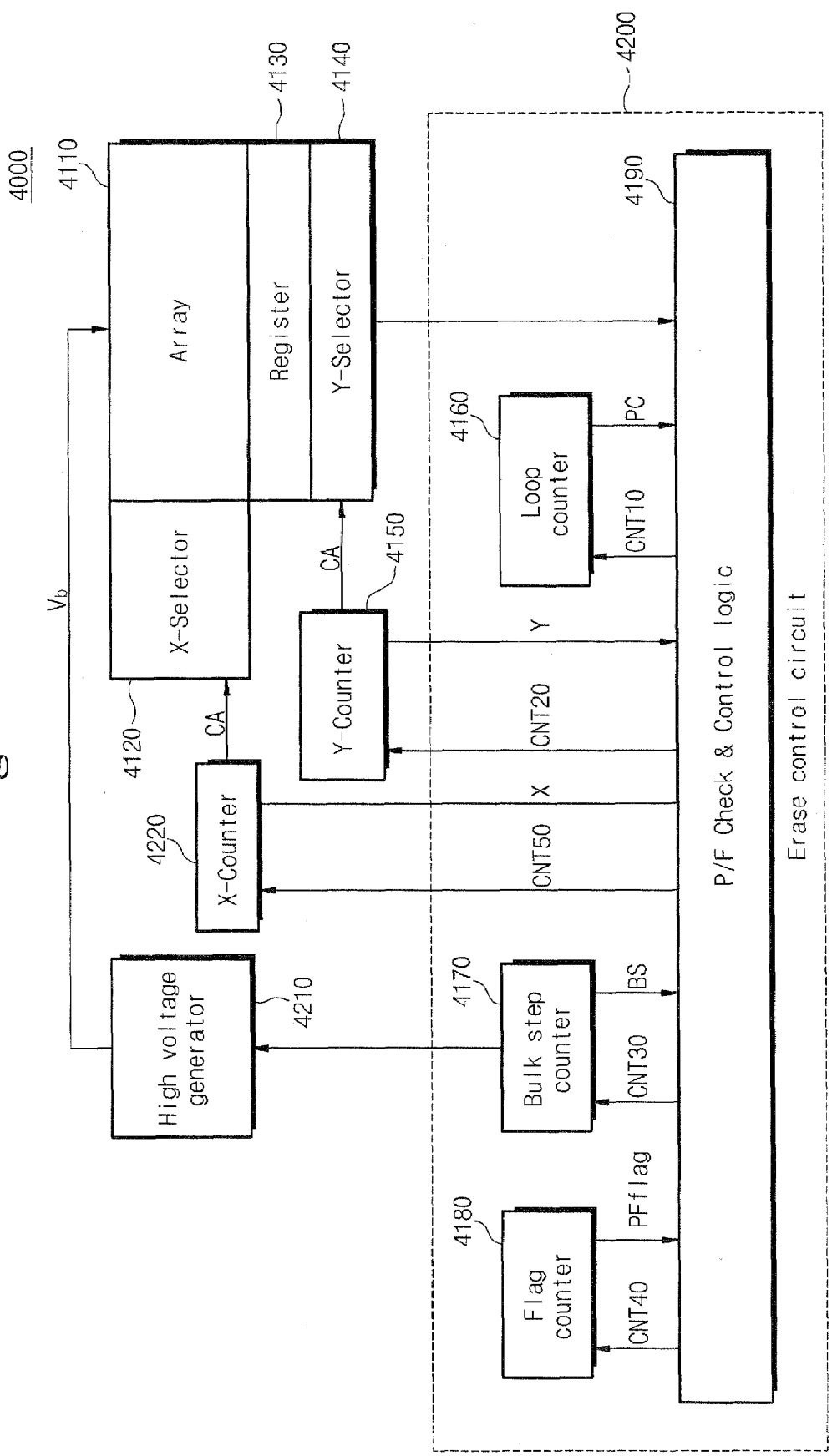
FIG. 20 is a block diagram of a flash memory device according to an embodiment of the present invention.
Figure 21A:
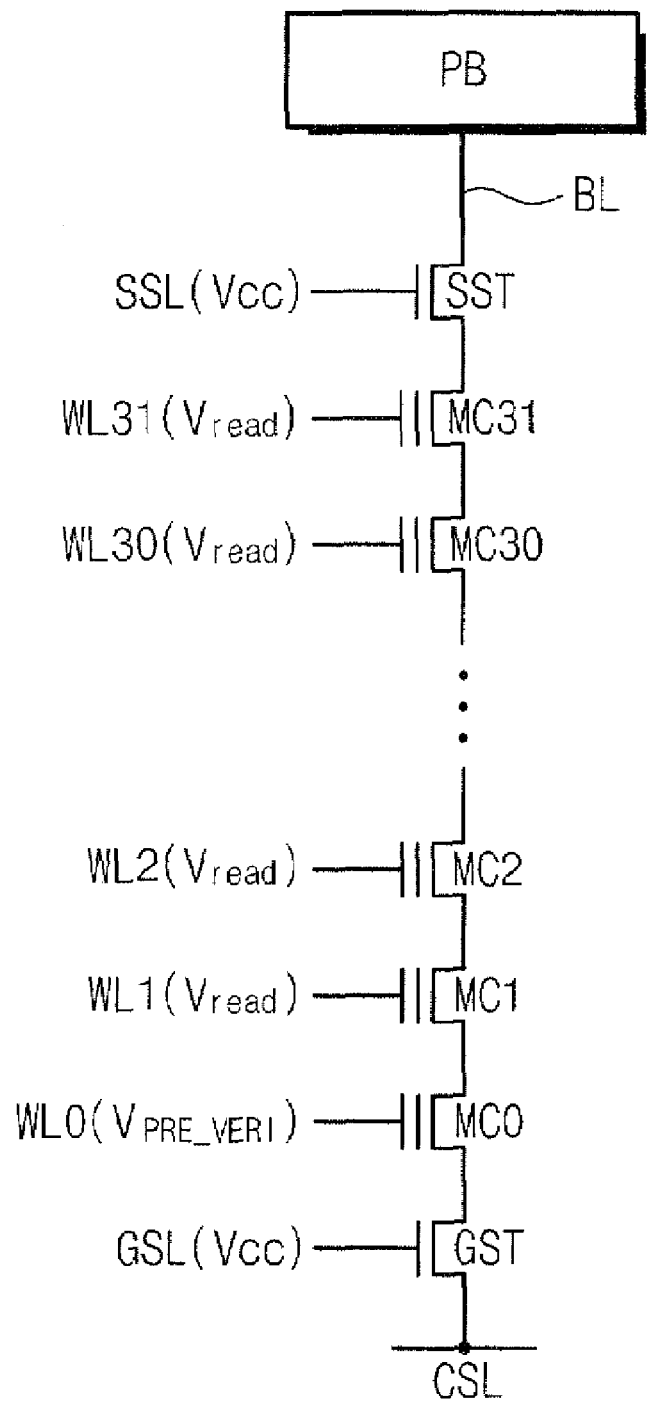
FIGS. 21A and 21B show bias conditions of wordlines during a pre-erase verify operation and an erase verify operation.
Figure 21B:
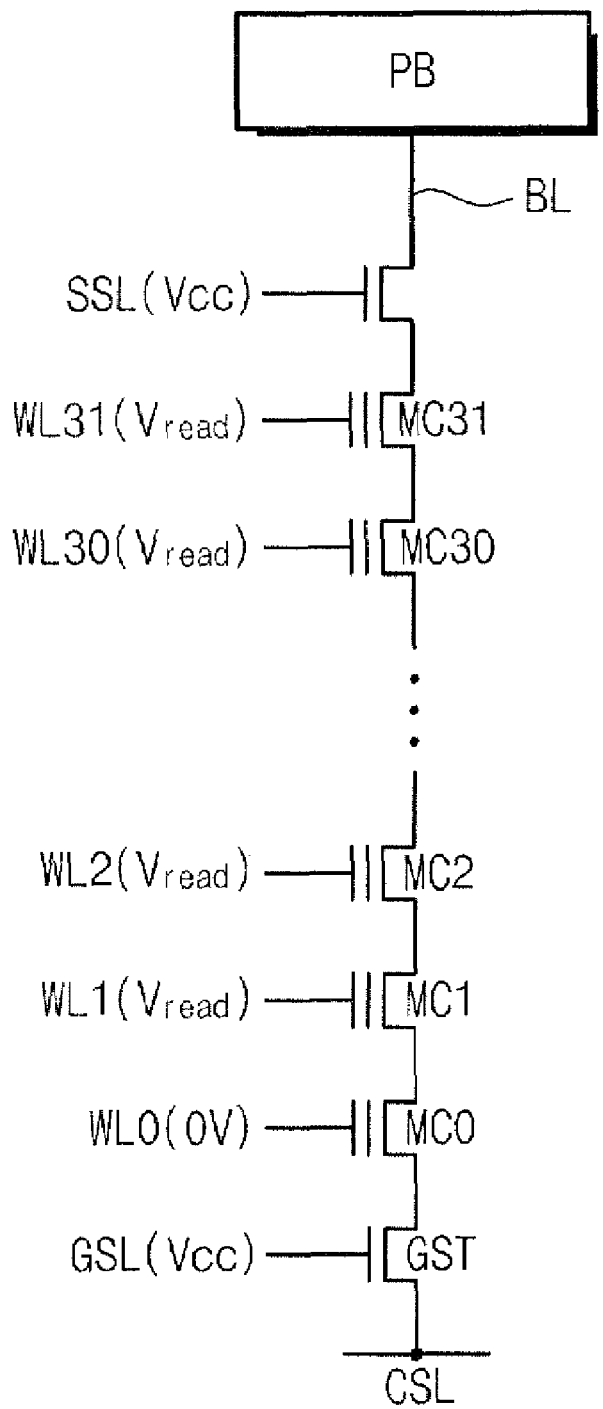

FIG. 20 is a block diagram of an embodiment of a flash memory device 4000. The flash memory device 4000 is substantially similar to that illustrated in FIG. 13 with the addition of an X-counter 4220. Elements 4110-4210 illustrated in FIG. 20 perform similar functions to those illustrated in FIG. 13 and will not be described in further detail. The flash memory device 4000 is configured to perform a verify operation that is different from that illustrated in FIG. 13. The verify operation of the flash memory device 3000 illustrated in FIG. 13 is performed while a pre-verify voltage $V_{PRE\_VERI}$ or an erase verify voltage (0V) is applied to all wordlines, as illustrated in FIGS. 17A and 17B. The verify operation of the flash memory device 4000 illustrated in FIG. 20 is performed while a pre-verify voltage $v_{PRE\_VERI}$ or an erase verify voltage (0V) is applied to one selected wordline and a read voltage Vread is applied to unselected wordlines, as illustrated in FIGS. 21A and 21B. The X-counter 4220 is provided for the flash memory device 4000 to sequentially select wordlines, which we describe in more detail below.

Figure 22:
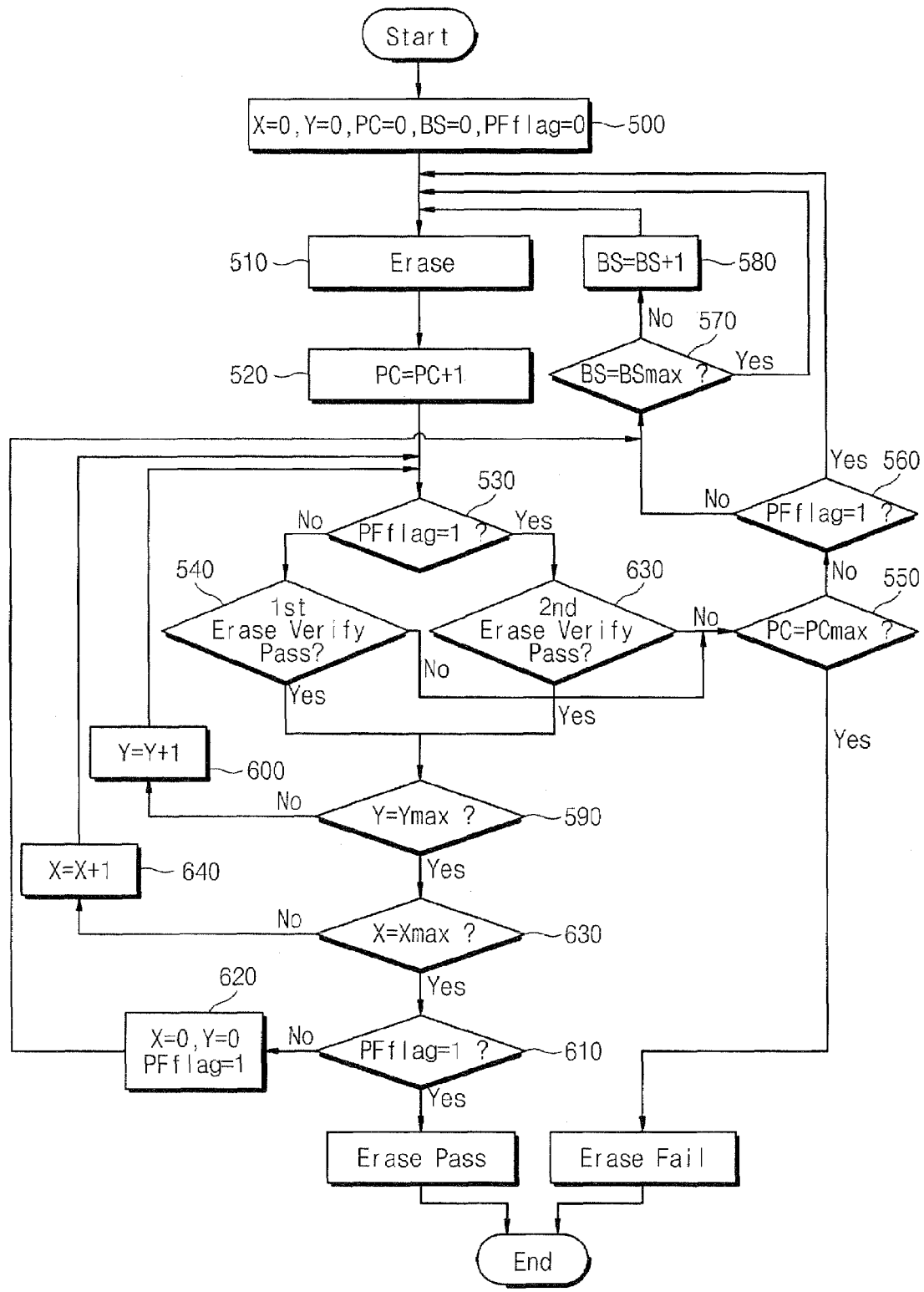
FIG. 22 is a flowchart of an embodiment of an erase method of the flash memory device illustrated in FIG, 20.

FIG. 22 is a flowchart of an embodiment of an erase method of the flash memory device 4000 illustrated in FIG. 20. In FIG. 22, the same steps as performed in FIG. 18 are designated by the same numerals and will not be described in further detail. At steps 500 and 620, the P/F check & control logic 3190 initializes an X-counter 4220 to a value "0." If a value X of a Y-counter 4150 reaches the maximum value Ymax at step 590, the P/F check & control logic 3190 checks whether the value X of the X-counter 4220 reaches the maximum value Xmax. If the value X of the X-counter 4220 reaches the maximum value Xmax, method proceeds to step 610. On the other hand, if the value X of the X-counter 4220 does not reach the maximum value Xmax, the P/F check & control logic 3190 increases the X-counter 4220 by "1," to select the next wordline. Afterwards, the foregoing operation is repeated until all wordlines are selected.

Figure 23:
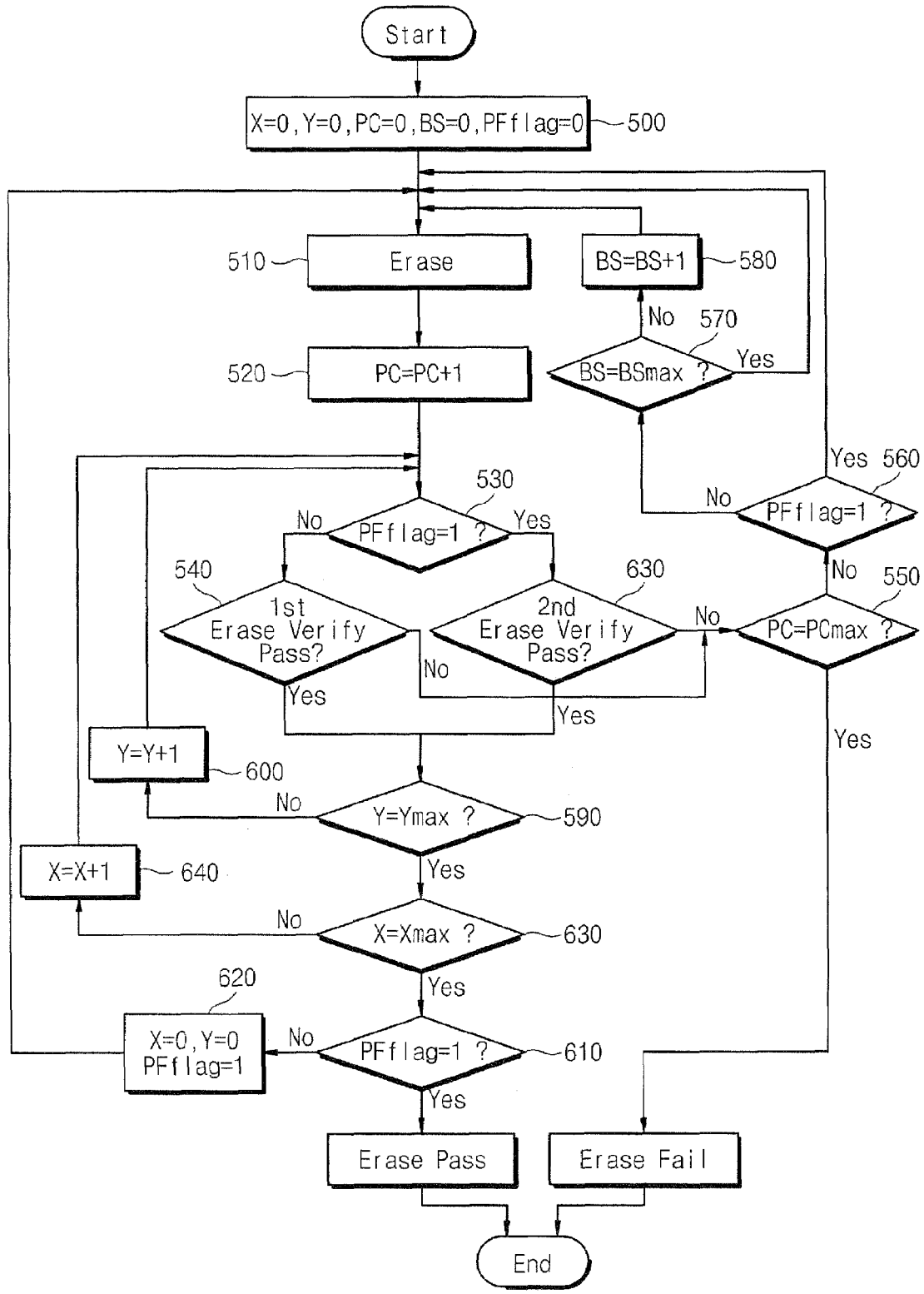
FIG. 23 is a flowchart of an embodiment of an erase method of the flash memory device illustrated in FIG. 20.

FIG. 23 is a flowchart of an embodiment of an erase method of the flash memory device illustrated 4000 in FIG. 20. In FIG. 23, the same steps as performed in FIG. 22 are designated by the same numerals and will not be described in further detail. The erase method illustrated in FIG. 23 is substantially similar to that illustrated in FIG. 22 except that the method proceeds to step 510 following step 620. According to the erase method illustrated in FIG. 23, an erase operation is performed at step 510 after setting the PFflag value of the flag counter 4180 to "1." This means the erase operation is performed without increase of a bulk voltage Vb after the first period of the erase operation ends, as illustrated in FIG. 19.

Figure 24:
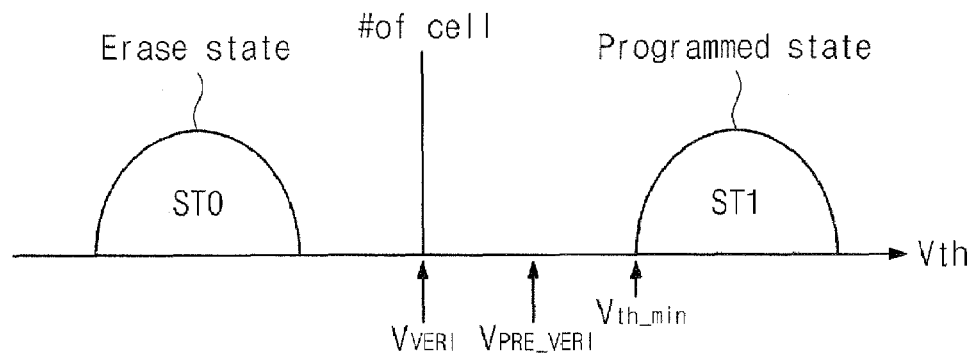
FIG. 24 shows the relationship between a pre-verify voltage and an erase verify voltage of a flash memory device where single-bit data is stored in one memory cell.

FIG. 24 shows the relationship between a pre-verify voltage and an erase verify voltage of a flash memory device where single-bit data is stored in one memory cell. In case of a flash memory device where single-bit data is stored in on memory cell, a memory cell is programmed to have either one of two threshold voltage distributions ST0 and ST1. In this case, a pre-verify voltage $V_{PRE\_VERI}$ exists between an erase verify voltage $V_{VERI}$ and a minimum threshold voltage Vth_min of the threshold voltage ST1.

Figure 25:
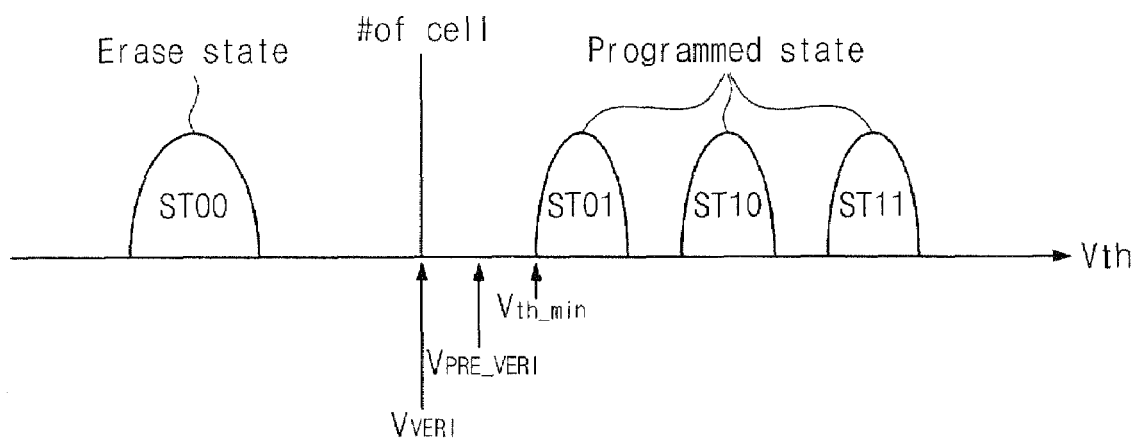
FIG. 25 shows the relationship between a pre-verify voltage and an erase verify voltage of a flash memory device where 2-bit data is stored in one memory cell.

FIG. 25 shows the relationship between a pre-verify voltage and an erase verify voltage of a flash memory device where 2-bit data is stored in one memory cell. In case of a flash memory device where 2-bit data is stored in one memory cell, a memory cell is programmed to one of four threshold voltage distributions ST00, ST01, ST10, and ST11. In this case, a pre-verify voltage $V_{PRE\_VERI}$ exists between an erase verify voltage $V_{VERI}$ and a minimum threshold voltage Vth_min of the threshold voltage ST01.

Although the present invention is expressed using the erase method where the bulk voltage in increased step by step, it is obvious that the present invention can be applied to an erase method where a wordline voltage is increased step by step. Furthermore, the erase method of decreasing the bulk voltage step by step can be incorporated in the scope of the present invention. Although the pre erase verification operation is shown as performed a single time, a person skilled in the art should recognize that the pre-erase verification operation can be carried out a number of times using various pre-verify voltage levels.

The invention has been described using exemplary preferred embodiments. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

I claim:

1. A NAND flash memory device comprising:
 a memory cell array formed on a substrate including a plurality of cell strings each including a string selecting transistor, a ground selecting transistor, and plural memory cells serially coupled between the string selecting transistor and the ground selecting transistor;
a high voltage generator configured to supply a bulk voltage to the substrate; and
an erase control circuit configured to stepwise increase the bulk voltage during a first period of an erase operation and to maintain the bulk voltage substantially constant during a second period of the erase operation.

2. The NAND flash memory device of claim 1 comprising:
a read circuit configured to read out data from the memory cell array responsive to the erase control circuit.

3. The NAND flash memory device of claim 2 where the erase control circuit is configured to control the high voltage generator during the first and second periods of the erase operation responsive to the read circuit reading out data from the memory cell that is pass data.

4. The NAND flash memory device of claim 2 where the erase control circuit comprises:
a pass/fail check and control logic;
a loop counter configured to count a number of loops responsive to the pass/fail check and control logic;
a bulk step counter configured to count a number of bulk steps responsive to the pass/fail check and control logic; and
a flag counter configured to output a flag signal responsive to the pass/fail check and control logic, the flag signal indicating an end of the first period of the erase operation.

5. The NAND flash memory device of claim 4 where the flag counter is configured to output the flag signal indicating the end of the first period of the erase operation responsive to the pass/fail check and control logic and responsive to the read circuit reading out data from the memory cell that is pass data.

6. The NAND flash memory device of claim 5 where the bulk step counter is configured not to increase the bulk voltage of a next loop included in the second period of the erase operation responsive to the pass/fail check and control logic and responsive to flag indicating the end of the first period of the erase operation.

7. The NAND flash memory device of claim 5 where the bulk step counter is configured to increase the bulk voltage of a next loop included in the second period by an increment while maintaining substantially constant the bulk voltage of other loops included in the second period responsive to the flag indicating the end of the first period of the erase operation.

8. The NAND flash memory device of claim 2 where during erase verify operations of respective loops included in the first period of the erase operation, the read circuit is configured to substantially simultaneously apply a first erase verify voltage to wordlines of the memory cell array responsive to the erase control circuit.

9. The NAND flash memory device of claim 8 where during erase verify operations of respective loops included in the second period of the erase operation, the read circuit is configured to substantially simultaneously apply a second erase verify voltage lower than the first erase verify voltage to the wordlines of the memory cell array responsive to the erase control circuit.

10. The NAND flash memory device of claim 2 where during erase verify operations of respective loops included in the first period of the erase operation, the read circuit is configured to apply a first erase verify voltage to a selected wordline of the memory cell array and to apply a read voltage to unselected wordlines of the memory cell array responsive to the erase control circuit.

11. The NAND flash memory device of claim 10 where during erase verify operations of respective loops included in the second period of the erase operation, the read circuit is configured to apply a second erase verify voltage lower than the first erase verify voltage to a selected wordline of the memory cell array and to apply a read voltage to unselected wordlines of the memory cell array.

12. A method, comprising:
supplying a bulk voltage to a substrate having formed thereon a memory cell array including a plurality of cell strings each having a string selecting transistor, a ground selecting transistor, and plural memory cells serially coupled between the string selecting transistor and the ground selecting transistor;
stepwise increasing the bulk voltage during a first period of an erase operation; and
maintaining the bulk voltage substantially constant during a second period of the erase operation.

13. The method of claim 12 comprising
reading out data from the memory cell array responsive to the erase control circuit.

14. The method of claim 13 comprising:
controlling a high voltage generator during the first and second periods of the erase operation responsive to determining the data read out from the memory cell array as pass data.

15. The method of claim 13 comprising:
counting a number of loops responsive to a pass/fail check and control logic;
counting a number of bulk steps responsive to the pass/fail check and control logic; and
setting a flag signal responsive to the pass/fail check and control logic to indicate an end of the first period of the erase operation.

16. The method of claim 15 comprising:
setting the flag indicating the end of the first period of the erase operation responsive to the pass/fail check and control logic and responsive to reading out data from the memory cell that is pass data.

17. The method of claim 16 comprising:
not increasing the bulk voltage of a next loop included in the second period of the erase operation responsive to the pass/fail check and control logic and responsive to setting the flag indicating the end of the first period of the erase operation.

18. The method of claim 16 comprising:
increasing the bulk voltage of a next loop included in the second period by an increment while maintaining substantially constant the bulk voltage of other loops included in the second period responsive to setting the flag indicating the end of the first period of the erase operation.

19. The method of claim 13 comprising:
substantially simultaneously applying a first erase verify voltage to wordlines of the memory cell array during erase verify operations of respective loops included in the first period of the erase operation.

20. The method of claim 19 comprising:
substantially simultaneously applying a second erase verify voltage lower than the first erase verify voltage to the wordlines of the memory cell array during erase verify operations of respective loops included in the second period of the erase operation.

21. The method of claim 13 comprising:

applying a first erase verify voltage to a selected wordline of the memory cell array; and applying a first read voltage to unselected wordlines of the memory cell array responsive to the erase control circuit;

where the applying the first erase verify voltage and the applying the first read voltage occur during erase verify operations of respective loops included in the first period of the erase operation.

22. The method of claim 21 comprising:

applying a second erase verify voltage lower than the first erase verify voltage to a selected wordline of the memory cell array; and applying a second read voltage to unselected wordlines of the memory cell array;

where the applying the second erase verify voltage and the second read voltage occur during erase verify operations of respective loops included in the second period of the erase operation.

* * * * *

UNITED STATES PATENT AND TRADEMARK OFFICE
CERTIFICATE OF CORRECTION

PATENT NO. : 7,366,020 B2  
APPLICATION NO. : 11/670383  
DATED : April 29, 2008  
INVENTOR(S) : Ki-Hwan Choi It is certified that error appears in the above-identified patent and that said Letters Patent is hereby corrected as shown below:

Column 6, line 57, the word "10" should read -- 110 --;  
Column 8, line 39, the word "2100," should read -- 2100. --;  
Column 8, line 49, the word "Yb." should read -- Vb. --;  
Column 9, line 53, the word "WL0-WL31" should read -- WL0-WL31, --;  
Column 10, line 60, the word "GST" should read -- GSL --.

Signed and Sealed this

Eleventh Day of November, 2008

JON W. DUDAS  
*Director of the United States Patent and Trademark Office*